(12) United States Patent
Lee

(10) Patent No.: US 12,471,478 B2
(45) Date of Patent: Nov. 11, 2025

(54) DISPLAY DEVICE

(71) Applicant: Samsung Display Co., LTD., Yongin-si (KR)

(72) Inventor: Hyeon Bum Lee, Hwaseong-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 18/404,269

(22) Filed: Jan. 4, 2024

(65) Prior Publication Data

US 2024/0147807 A1 May 2, 2024

Related U.S. Application Data

(63) Continuation of application No. 17/973,782, filed on Oct. 26, 2022, now Pat. No. 11,903,295.

(30) Foreign Application Priority Data

Mar. 11, 2022 (KR) .................. 10-2022-0030798

(51) Int. Cl.
| | |
|---|---|
| *H10K 59/40* | (2023.01) |
| *G06F 3/044* | (2006.01) |
| *H10K 50/844* | (2023.01) |
| *H10K 50/858* | (2023.01) |
| *H10K 50/86* | (2023.01) |
| *H10K 59/123* | (2023.01) |

(52) U.S. Cl.
CPC .......... *H10K 59/40* (2023.02); *G06F 3/0446* (2019.05); *H10K 50/844* (2023.02); *H10K 50/858* (2023.02); *H10K 50/865* (2023.02); *H10K 59/123* (2023.02)

(58) Field of Classification Search
CPC .............................. G06F 3/0446; H10K 59/40
See application file for complete search history.

(56) References Cited

U.S. PATENT DOCUMENTS

| | | |
|---|---|---|
| 11,903,295 B2* | 2/2024 | Lee ...................... G06F 3/0446 |
| 2019/0018280 A1 | 1/2019 | Kim et al. |
| 2020/0075473 A1 | 3/2020 | Pietambaram et al. |
| 2020/0198535 A1 | 6/2020 | Kontani |
| 2020/0212140 A1 | 7/2020 | Huh |
| 2021/0242433 A1 | 8/2021 | Xiao |
| 2022/0069052 A1* | 3/2022 | Liu ........................ H10K 59/40 |
| 2022/0164051 A1 | 5/2022 | Lee et al. |
| 2022/0206615 A1 | 6/2022 | Kong et al. |

FOREIGN PATENT DOCUMENTS

| | | |
|---|---|---|
| KR | 10-2021-0048323 | 5/2021 |
| KR | 10-20210081701 | 7/2021 |
| KR | 10-2021-0127270 | 10/2021 |

* cited by examiner

*Primary Examiner* — Kevin M Nguyen
(74) *Attorney, Agent, or Firm* — Harness, Dickey & Pierce, P.L.C.

(57) ABSTRACT

A display device includes a display area and a non-display area; a light emitting element disposed on a display area of a substrate; a dam disposed on a non-display area of the substrate; an encapsulation layer disposed on the light emitting element and the dam; a planarization layer disposed on the encapsulation layer; and a sensing electrode disposed on the planarization layer, wherein a thickness of a portion of the planarization layer disposed in the non-display area gradually increases as the portion of the planarization layer is away from the display area.

19 Claims, 14 Drawing Sheets

DISPLAY DEVICE

CROSS REFERENCE TO RELATED APPLICATION(S)

This is a continuation application of U.S. patent application Ser. No. 17/973,782, filed Oct. 26, 2022 (now pending), the disclosure of which is incorporated herein by reference in its entirety. U.S. patent application Ser. No. 17/973,782 claims priority to and benefits of Korean Patent Application No. 10-2022-0030798 under 35 U.S.C. § 119, filed Mar. 11, 2022 in the Korean Intellectual Property Office, the entire contents of which are incorporated herein by reference.

BACKGROUND

1. Technical Field

The disclosure relates to a display device.

2. Description of the Related Art

A display device is a device for displaying an image and includes a liquid crystal display (LCD), an organic light emitting diode (OLED) display, and the like. The display device is used in various electronic devices such as a mobile phone, a navigation device, a digital camera, an electronic book, a portable game machine, and various terminals.

As an input device of such an electronic device, a touch sensor in which a user inputs information by contacting a screen with a finger or a pen may be used. Among various sensing methods of the touch sensor, a capacitive type is mainly used for detecting a position at which a capacitance changes because of a touch occurs in two electrodes spaced apart from each other.

Several conductive layers and several insulating layers may be disposed under the touch sensor, and a distance between an electrode of the touch sensor and a conductive layer disposed thereunder may be different depending on a planar position of a panel. Accordingly, parasitic capacitance may increase, and touch sensitivity may deteriorate in a portion in which the distance between the electrode of the touch sensor and the conductive layer disposed thereunder is relatively close.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a display device that may reduce a difference in parasitic capacitance according to a position (e.g., in a plan view), and may improve touch sensitivity.

An embodiment provides a display device. The display device may include a display area and a non-display area; a light emitting element disposed on a display area of a substrate; a dam disposed on a non-display area of the substrate; an encapsulation layer disposed on the light emitting element and the dam; a planarization layer disposed on the encapsulation layer; and a sensing electrode disposed on the planarization layer, wherein a thickness of a portion of the planarization layer disposed in the non-display area may gradually increase as the portion of the planarization layer is away from the display area.

An upper surface of the planarization layer may be flat.

The encapsulation layer may include a first inorganic encapsulation layer; a second inorganic encapsulation layer disposed on the first inorganic encapsulation layer; and an organic encapsulation layer disposed between the first inorganic encapsulation layer and the second inorganic encapsulation layer, the first inorganic encapsulation layer and the second inorganic encapsulation layer may be entirely disposed in the display area and the non-display area, and the organic encapsulation layer may not be disposed in at least a portion of the non-display area.

The organic encapsulation layer may extend from the display area to the dam.

A thickness of a portion of the organic encapsulation layer disposed in the non-display area may gradually decrease as the portion of the organic encapsulation layer is away from the display area.

The display device may further include an opening area disposed in the display area and an opening periphery area surrounding the opening area, wherein the organic encapsulation layer may not be disposed in at least a portion of the opening periphery area.

A thickness of a portion of the planarization layer disposed in the opening periphery area may gradually increase as the portion of the planarization layer approaches the opening area.

A thickness of the planarization layer disposed at an edge of the non-display area may be about 6 μm or more.

The planarization layer may be formed by a slit coating method.

The display device may further include a transistor disposed on the substrate in the display area, wherein the light emitting element may further include a pixel electrode electrically connected to the transistor, a light emitting layer disposed on the pixel electrode, and a common electrode disposed on the light emitting layer, and the common electrode may extend from the display area onto the dam.

The display device may further include an organic encapsulation layer disposed between the sensing electrode and the common electrode, wherein a thickness of a portion of the organic encapsulation layer may be gradually decreased corresponding to a portion in which a thickness of the planarization layer is gradually increased.

The display device may further include a bank layer disposed on the pixel electrode and including a pixel opening overlapping a central portion of the pixel electrode in a plan view.

The display device may further include a first insulating layer disposed on the sensing electrode and including an opening overlapping the pixel opening in a plan view, and a second insulating layer disposed on the first insulating layer, wherein a refractive index of the second insulating layer may be larger than a refractive index of the first insulating layer.

The opening may be disposed in the display area and may not be disposed in the non-display area.

The display device may further include a first insulating layer disposed on the planarization layer and overlapping the pixel opening in a plan view, and a second insulating layer disposed on the first insulating layer, wherein a refractive index of the second insulating layer may be smaller than a refractive index of the first insulating layer.

The first insulating layer may be entirely disposed in the non-display area.

The display device may further include a light blocking layer disposed on the planarization layer and overlapping the sensing electrode in a plan view.

The light blocking layer may be entirely disposed in the non-display area.

The display device may further include a reflection adjusting layer disposed on the light blocking layer and the planarization layer and including a dye or a pigment absorbing light of a specific wavelength.

The reflection adjustment layer may be entirely disposed in the display area and the non-display area.

According to the embodiments, it may be possible to reduce a difference in parasitic capacitance according to a position in a plan view of a display device and improve touch sensitivity by flattening a lower portion of a touch sensor.

BRIEF DESCRIPTION OF THE DRAWINGS

FIG. 3 is enlarged.

DETAILED DESCRIPTION OF THE EMBODIMENTS

Figure 1:
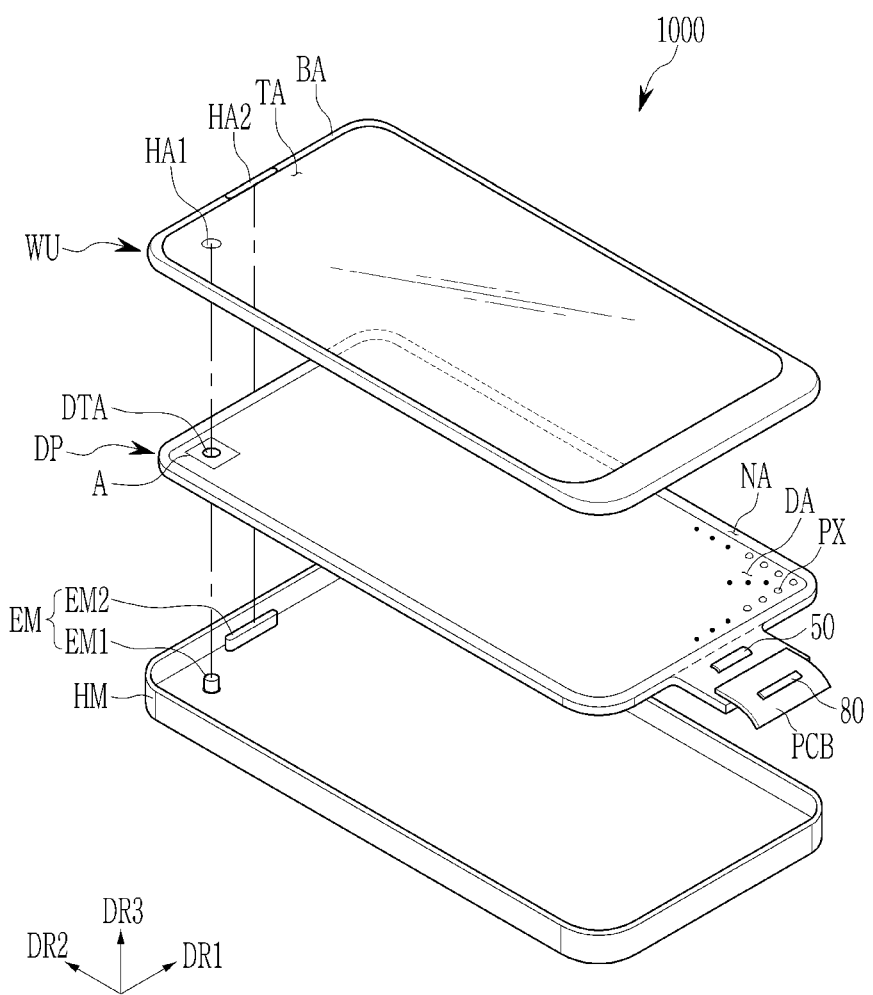
FIG. 1 illustrates a schematic exploded perspective view of a display device according to an embodiment.

The disclosure will be described more fully hereinafter with reference to the accompanying drawings, in which embodiments of the invention are shown. As those skilled in the art would realize, the described embodiments may be modified in various different ways, all without departing from the spirit or scope of the disclosure.

In order to clearly describe the disclosure, parts or portions that are irrelevant to the description are omitted, and identical or similar constituent elements throughout the specification are denoted by same reference numerals.

Unless otherwise specified, the illustrated embodiments are to be understood as providing example features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

Further, in the drawings, the size and thickness of each element are arbitrarily illustrated for ease of description, and the disclosure is not necessarily limited to those illustrated in the drawings. In the drawings, the thicknesses of layers, films, panels, regions, areas, etc., may be exaggerated for clarity. In the drawings, for ease of description, the thicknesses of some layers and areas may be exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned or disposed on or below the object portion, and does not necessarily mean positioned or disposed on the upper side of the object portion based on a gravitational direction.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

Unless explicitly described to the contrary, the word "comprise" "include," or "have" and variations thereof such as "comprises" or "comprising" will be understood to imply the inclusion of stated elements but not the exclusion of any other elements.

The terminology used herein is for the purpose of describing particular embodiments and is not intended to be limiting. As used herein, the singular forms, "a," "an," and "the" are intended to include the plural forms as well, unless the context clearly indicates otherwise. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

The term "contact" or "connect" may refer to physical, electrical, and/or fluid connection, with or without intervening elements.

The term "overlap" or "at least partially overlap" as used herein may mean that at least part of a first object faces at least part of a second object in a given direction or given view.

The phrase "at least one of" is intended to include the meaning of "at least one selected from the group of" for the purpose of its meaning and interpretation. For example, "at least one of A and B" may be understood to mean "A, B, or A and B."

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A display device according to an embodiment will be schematically described with reference to FIG. 1 to FIG. 3. FIG. 1 illustrates a schematic exploded perspective view of a display device according to an embodiment, FIG. 2 illustrates a schematic cross-sectional view of a display device according to an embodiment, and FIG. 3 illustrates a schematic top plan view of some constituent elements of a display panel according to an embodiment.

Figure 2:
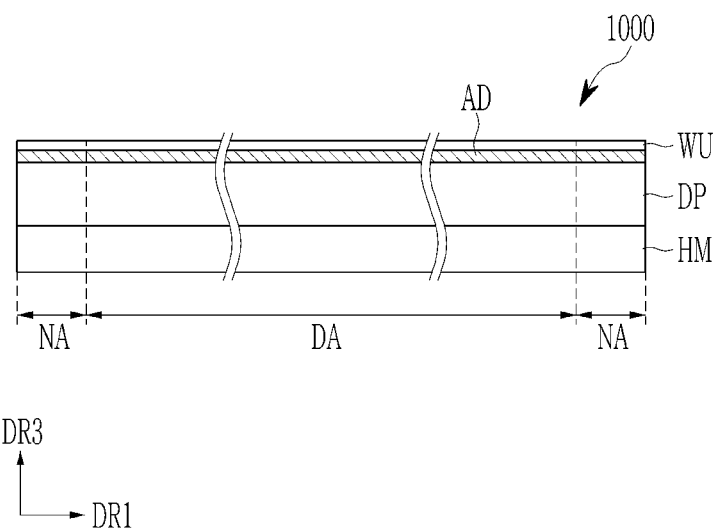
FIG. 2 illustrates a schematic cross-sectional view of a display device according to an embodiment.
Figure 3:
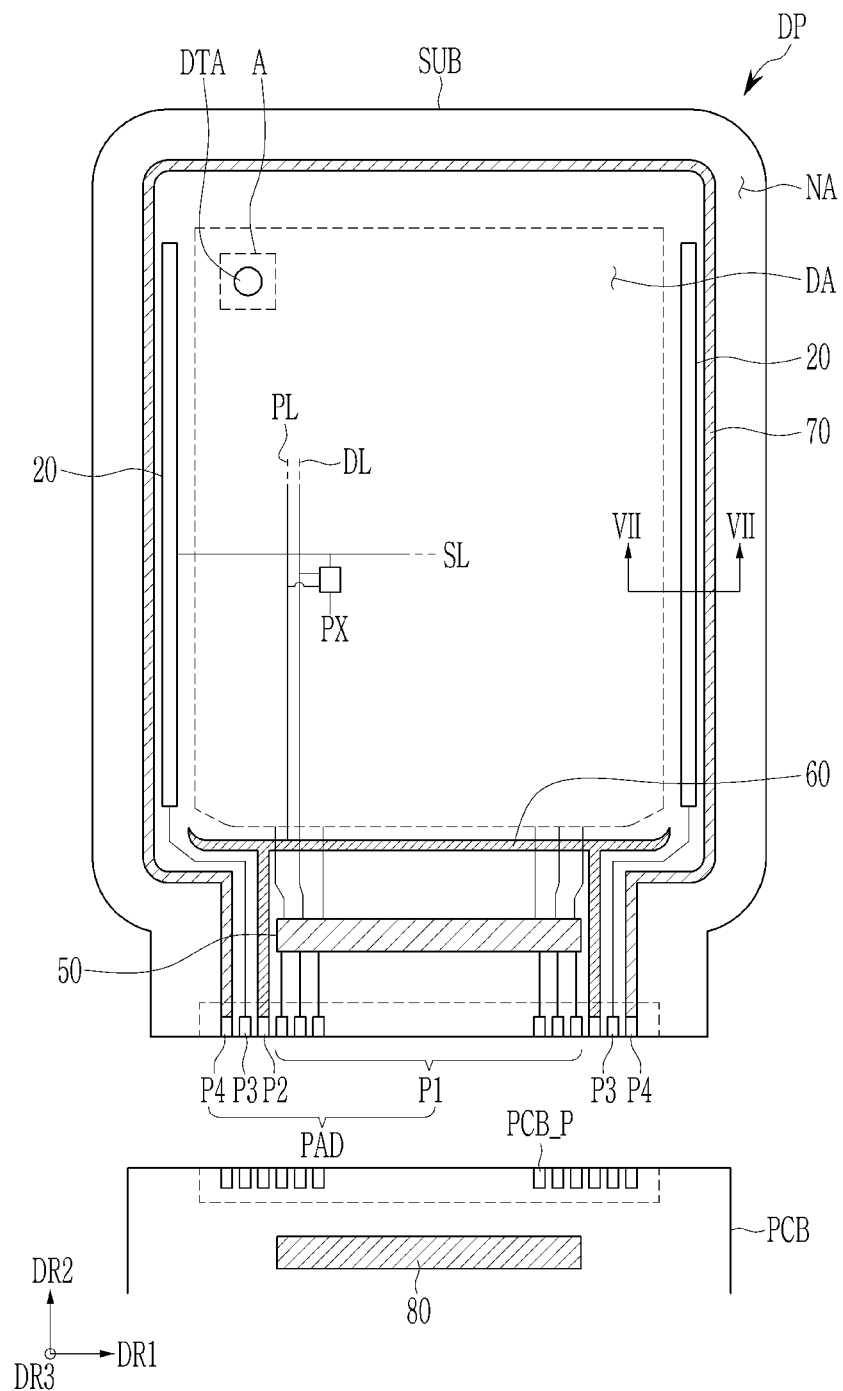
FIG. 3 illustrates a schematic top plan view of some constituent elements of a display panel according to an embodiment.

First, referring to FIG. 1 and FIG. 2, a display device 1000 according to an embodiment may display an image toward a third direction DR3 on a plane defined by a first direction DR1 and a second direction DR2. A front surface (or upper surface) and a back surface (or lower surface) of each member may be divided by the third direction DR3. Directions indicated by the first to third direction DR1, DR2, and DR3 are relative concepts, thus they may be changed into other directions.

The display device 1000 according to the embodiment may include a cover window WU, a display panel DP, and a housing member HM. In the embodiment, the cover window WU, the display panel DP, and the housing member HM may be combined to form the display device 1000.

The cover window WU may be disposed on the display panel DP to protect the display panel DP. The cover window WU may include a transmission area TA and a blocking area BA. The transmission area TA may be an optically transparent area, and may be an area through which incident light is transmitted. The blocking area BA may be an area having relatively low light transmittance compared with the transmission area TA. The blocking area BA may define a shape of the transmission area TA. The blocking area BA may surround the transmission area TA. The blocking area BA may display a color (e.g., a predetermined and selectable color). The blocking area BA may overlap a non-display area NA of the display panel DP to block the non-display area NA from being viewed from an outside.

The cover window WU may include a first hole area HA1 and a second hole area HA2. Each of the first hole area HA1 and the second hole area HA2 may overlap an electronic module EM to be described below. The electronic module EM may operate by receiving external signals provided through the first hole area HA1 and the second hole area HA2.

According to the embodiment, the first hole area HA1 may be disposed in the transmission area TA, and the second hole area HA2 may be disposed in the blocking area BA. However, this is merely illustrative, and the first hole area HA1 and the second hole area HA2 may be disposed in opposite areas, all of them may be disposed in the transmission area TA, or all of them may be disposed in the blocking area BA. The number of the hole areas is not limited to two, and three or more hole areas may be formed.

In each of the first hole area HA1 and the second hole area HA2, a depression recessed from a rear surface of the cover window WU may be defined. The depression may include a groove portion or an opening having a depth smaller than a thickness of the cover window WU.

The first hole area HA1 and the second hole area HA2 may have different shapes. The first hole area HA1 may have a circular shape in a plan view, and the second hole area HA2 may have an elliptical shape having a long axis extending in the first direction DR1 in a plan view. However, shapes of the first hole area HA1 and the second hole area HA2 are not limited thereto, and sizes or shapes thereof may be variously changed.

The display panel DP may be a flat rigid display panel, but is not limited thereto, and may be a flexible display panel. The display panel DP according to the embodiment may be a light emitting type of display panel, but is not particularly limited thereto. For example, the display panel DP may be an organic light emitting display panel or a quantum dot light emitting display panel. A light emitting layer of the organic light emitting display panel may include an organic light emitting material. A light emitting layer of the quantum dot light emitting display panel may include quantum dots, quantum rods, and the like. Hereinafter, the display panel DP will be described as an organic light emitting display panel.

An image may be displayed on a front surface of the display panel DP. The front surface of the display panel DP may include a display area DA and a non-display area NA. An image may be displayed on the display area DA. The non-display area NA may surround the display area DA.

The display panel DP may include pixels PX disposed in the display area DA. The pixels PX may display light in response to an electrical signal. The light displayed by the pixels PX may implement an image. The number of transistors and capacitors included in one pixel PX and their connection relationship may be variously changed.

The display panel DP according to the embodiment may include an opening area DTA penetrating through the display panel DP. The opening area DTA may be disposed in the display area DA. Hereinafter, area "A" in which the opening area DTA is disposed will be described. The opening area DTA may overlap the first hole area HA1 of the cover window WU. Some of the pixels PX may be disposed to surround the opening area DTA. Accordingly, an image may be displayed even in an area adjacent to the opening area DTA.

The display panel DP may be extended from the display area DA to include the non-display area NA in which signal lines and a pad part are disposed. A data driver 50 may be disposed in the non-display area NA. According to the embodiment, the pad part of the non-display area NA may be electrically connected to a printed circuit board PCB including a driving chip 80, which will be described in more detail below with reference to FIG. 3.

As shown in FIG. 2, an adhesive layer AD for bonding the display panel DP and the cover window WU may be disposed between the display panel DP and the cover window WU.

The electronic module EM may include various functional modules for operating the display device 1000. The electronic module EM may be electrically connected to the display panel DP through a connector or the like (not shown). For example, the electronic module EM may be a camera, a speaker, or a light or heat sensing sensor.

The electronic module EM may include a first electronic module EM1 and a second electronic module EM2. The first electronic module EM1 may sense an external subject received through the opening area DTA and the first hole area HA1 The first electronic module EM1 may receive an external input transmitted through the opening area DTA and the first hole area HA1 or may provide an output through the opening area DTA and the first hole area HA1.

For example, the first electronic module EM1 may be at least one of a light emitting module, a light sensing module, and a photographing module. For example, the first electronic module EM1 may include at least one of a light emitting module for outputting infrared rays, a CMOS sensor for sensing infrared rays, and a camera module for photographing an external subject.

The second electronic module EM2 may collect a sound signal such as voice through the second hole area HA2, or may provide a sound signal such as processed voice to an outside. For example, the second electronic module EM2 may include at least one of a sound input module and a sound output module. The sound input module may include a microphone capable of receiving a sound signal. The sound output module may include a speaker that outputs sound data as a sound signal.

However, this is illustrated as an example, and the electronic module EM may be configured of a single module, or may further include a greater number of electronic modules, and may be arranged in various arrangement relationships, but is not limited to an embodiment.

The housing member HM may be disposed at a lower side of the display panel DP. The housing member HM may be combined with the cover window WU to form an appearance of the display device 1000. The housing member HM may contain a material with relatively high rigidity. For example, the housing member HM may include frames and/or plates made of (or including) glass, plastic, and metal.

The housing member HM may provide an accommodation space. The display panel DP may be accommodated in the accommodation space to be protected from external impact.

Next, referring to FIG. 3, the display panel DP may include a substrate SUB including the display area DA and the non-display area NA. The non-display area NA may be defined along an edge of the display area DA.

The display panel DP may include pixels PX. The pixels PX may be disposed in the display area DA on the substrate SUB. Each of the pixels PX may include a light emitting element and a driving circuit connected to the light emitting element. Each pixel PX may emit, for example, red, green, blue, or white light, and may include an organic light emitting element (or organic light emitting diode) as an example.

The display panel DP may include signal lines and a pad part. The signal lines may include a scan line SL extending in the first direction DR1, and a data line DL and a driving voltage line PL extending in the second direction DR2.

A scan driver 20 may generate a scan signal to transmit it to each pixel PX through the scan line SL. According to the embodiment, the scan driver 20 may be disposed at left or right sides of the display area DA. In the specification, a structure in which the scan driver 20 is disposed at sides of the substrate SUB is shown, but in another embodiment, the scan driver 20 may be disposed at a side of the substrate SUB.

A pad part PAD may be disposed at an end portion of the display panel DP, and may include terminals P1, P2, P3, and P4. The pad part PAD may be exposed without being covered by an insulating layer to be electrically connected to the printed circuit board PCB. The pad part PAD may be electrically connected to a pad part PCB_P of the printed circuit board PCB. The printed circuit board PCB may transmit a signal or power source of the IC driving chip 80 to the pad part PAD.

The controller may convert image signals transmitted from an outside into image data signals, and may transmit the converted signals to the data driver 50 through the terminal P1. The controller may receive a vertical synchronization signal, a horizontal synchronization signal, and a clock signal, and may generate a control signal for controlling operations of the scan driver 20 and the data driver 50 to transmit it to each of the scan driver 20 and the data driver 50 through the terminals P3 and P1. The controller may transmit a driving voltage ELVDD to a driving voltage supply wire 60 through the terminal P2. The controller may transmit a common voltage ELVSS to each common voltage supply wire 70 through the terminal P4.

The data driver 50 may be disposed on the non-display area NA, and may generate a data signal to transmit it to each pixel PX. The data driver 50 may be disposed at a side of the display panel DP, and for example, may be disposed between the pad part PAD and the display area DA.

The driving voltage supply wire 60 may be disposed on the non-display area NA. For example, the driving voltage supply wire 60 may be disposed between the data driver 50 and the display area DA. The driving voltage supply wire 60 may provide a driving voltage ELVDD to the pixels PX. The driving voltage supply wire 60 may be disposed in the first direction DR1, and may be connected to driving voltage lines PL disposed in the second direction DR2.

The common voltage supply wire 70 may be disposed on the non-display area NA. The common voltage supply wire 70 may have a shape surrounding a substrate SUB. The common voltage supply wire 70 may transmit the common voltage ELVSS to an electrode (for example, a second electrode) of the light emitting element included in the pixel PX.

Figure 4:
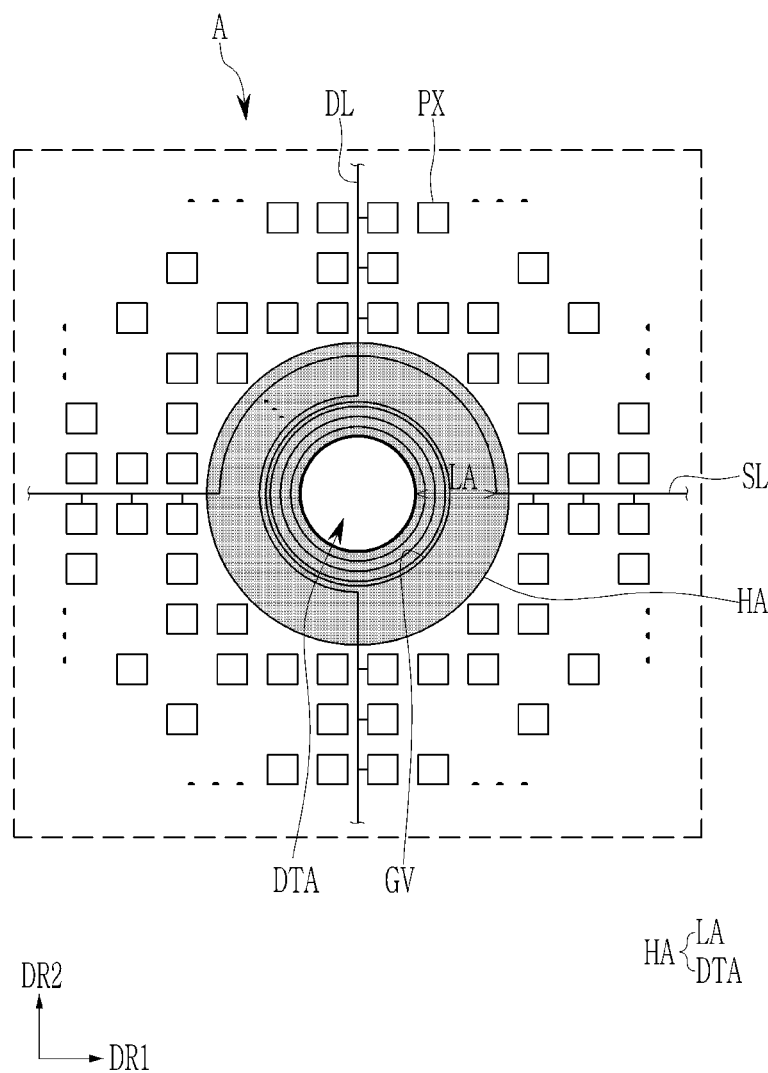
FIG. 4 illustrates a schematic top plan view in which area "A" of FIG. 1

Hereinafter, area "A" including the opening area DTA shown in FIG. 3 will be described with reference to FIG. 4. FIG. 4 illustrates a schematic top plan view in which the area "A" of FIG. 1 and FIG. 3 is enlarged.

Referring to FIG. 4 together with the above-described drawings, the display panel DP may include signal lines SL and DL and pixels PX disposed on the substrate SUB. Each of the pixels PX may be connected to the signal lines SL and DL. FIG. 4 illustrates the scan line SL and the data line DL among signal lines. However, this is illustrated as an example, and each of the pixels PX according to the embodiment may be additionally connected to various signal lines, and is not limited to an embodiment.

A hole area HA included in the display panel DP may include the opening area DTA and an opening peripheral area LA surrounding the opening area DTA. The opening periphery area LA may be an area surrounding a periphery of the opening area DTA. A minimum width of the opening peripheral area LA may be required to be maintained at a constant width. The opening periphery area LA may include a groove GV.

The scan line SL and the data line DL may have a semicircular structure, may overlap the opening peripheral area LA, and may be bypassing the opening area DTA. The scan lines SL may extend in a horizontal direction (e.g., first direction DR1) along a periphery of the opening area DTA. Here, the scan lines SL may be configured of a scan line, a light emitting control line, an initialization voltage line, or the like according to signals. The data lines DL may extend in a vertical direction (e.g., second direction DR2) along the periphery of the opening area DTA. The data lines DL may be configured of a driving voltage line, a driving low voltage line, or the like according to signals. In some embodiments, the scan lines SL and the data lines DL may be changed.

The display device 1000 according to the embodiment may further include a sensing sensor disposed between the display panel DP and the cover window WU. The sensing sensor may be disposed on the display panel DP for a touchscreen function of the display device 1000. The sensing sensor may include a sensing electrode of various patterns, and may be formed as a resistive film type or a capacitive type. Hereinafter, referring to FIG. 5, an embodiment in which the display device 1000 according to the embodiment includes a capacitance type of sensing sensor will be described.

Figure 5:
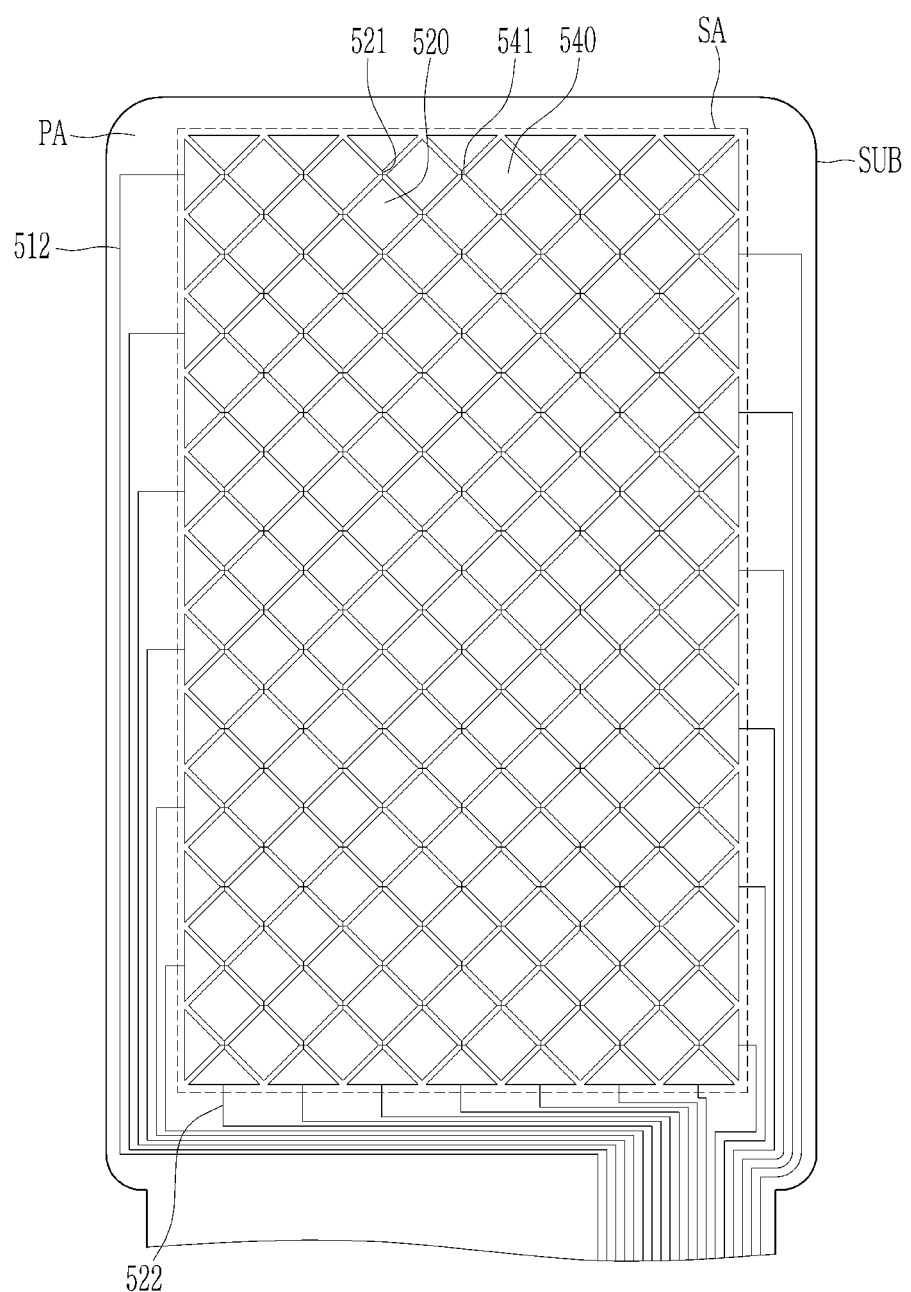
FIG. 5 illustrates a schematic top plan view of a portion including a sensing sensor of a display device according to an embodiment.

FIG. 5 illustrates a schematic top plan view of a portion including a sensing sensor of a display device according to an embodiment.

The substrate SUB may further include a sensing area SA having sensing electrodes 520 and 540 formed on an upper portion of the display area DA, and a peripheral area PA surrounding the sensing area SA. In some embodiments, the sensing area SA may include portions of the display area DA and the non-display area NA of FIG. 3, and the peripheral area PA may include an area excluding the sensing area SA from the non-display area NA of FIG. 3. However, this is merely an example, and positions of the sensing area SA and the peripheral area PA may be variously changed. For example, the sensing area SA may include a portion of the display area DA, and the peripheral area PA may include an area excluding the sensing area SA from the display area DA and the non-display area NA. As another example, the sensing area SA may include the display area DA and the non-display area NA.

The sensing area SA may include the sensing electrodes 520 and 540. The sensing electrodes 520 and 540 may include first sensing electrodes 520 and second sensing electrodes 540.

The first sensing electrode 520 and the second sensing electrode 540 may be electrically separated from each other. In some embodiments, the first sensing electrode 520 may be a sensing input electrode, and the second sensing electrode 540 may be a sensing output electrode. However, the disclosure is not limited thereto, and the first sensing electrode 520 may be a sensing output electrode, and the second sensing electrode 540 may be a sensing input electrode.

The first sensing electrodes 520 and the second sensing electrodes 540 may be alternately dispersed so as to not overlap each other in the sensing area SA to be disposed in a mesh form. The first sensing electrodes 520 may be disposed in a column direction and a row direction, and the second sensing electrodes 540 may also be disposed in the column direction and in the row direction. The first sensing electrodes 520 may be connected to each other in the column direction by first sensing electrode connecting parts 521, and the second sensing electrodes 540 may be connected to each other in the row direction by second sensing electrode connecting parts 541.

The first sensing electrode 520 and the second sensing electrode 540 may be disposed on a same layer. In some embodiments, the first sensing electrode 520 and the second sensing electrode 540 may be disposed on different layers. The first sensing electrode 520 and the second sensing electrode 540 may have a rhombus shape, but are not limited thereto. The first sensing electrode 520 and the second sensing electrode 540 may be polygonal such as quadrangular or hexagonal, or may be circular or oval, and may be implemented in various shapes such as having a protrusion to improve sensitivity of a sensing sensor. The first sensing electrode 520 and the second sensing electrode 540 may be formed of a transparent conductor or an opaque conductor. For example, the first sensing electrode 520 and the second sensing electrode 540 may include a transparent conductive oxide (TCO), and the transparent conductive oxide (TCO) may include at least one of an indium tin oxide (ITO), an indium zinc oxide (IZO), a zinc oxide (ZnO), a carbon nanotube (CNT), grapheme, and the like. The first sensing electrode 520 and the second sensing electrode 540 may include openings. The openings formed in the sensing electrodes 520 and 540 may serve to allow light emitted from the light emitting diode to be directed to a front without interference.

The first sensing electrodes 520 may be electrically connected to each other by the first sensing electrode connecting part 521 (also referred to as a bridge), and the second sensing electrodes 540 may be electrically connected to each other by the second sensing electrode connecting part 541. In case that the first sensing electrodes 520 are connected in a first direction, the second sensing electrodes 540 may be connected in a second direction crossing the first direction. In case that the first sensing electrode 520 and the second sensing electrode 540 are disposed on a same layer, one of the first sensing electrode connecting part 521 and the second sensing electrode connecting part 541 may be disposed on the same layer as the first sensing electrode 520 and the second sensing electrode 540, and the other thereof may be disposed on a different layer from the first sensing electrode 520 and the second sensing electrode 540. As a result, the first sensing electrodes 520 and the second sensing electrodes 540 may be electrically separated. The sensing electrode connecting part disposed on the different layer may be disposed on upper or lower layers of the first sensing electrode 520 and the second sensing electrode 540, and in an embodiment to be described below, an embodiment in which the sensing electrode connecting part is disposed on the lower layer, that is, a layer closer to the substrate SUB, will be mainly described.

Each of sensing wires 512 and 522 connected to the first sensing electrodes 520 and the second sensing electrodes 540 may be disposed in the peripheral area PA. The sensing wires 512 and 522 may include first sensing wires 512 and second sensing wires 522. The first sensing wire 512 may be connected to the second sensing electrodes 540 disposed in the row direction, and the second sensing wire 522 may be connected to the first sensing electrodes 520 disposed in the column direction. In some embodiments, the first sensing wire 512 and the second sensing wire 522 may be electrically connected to a portion of the pad PAD included in the pad part of FIG. 3.

FIG. 5 illustrates a mutual-cap type of sensing sensor that senses a touch by using two sensing electrodes 520 and 540. However, in some embodiments, a self-cap type of sensing sensor that senses a touch by using one of the sensing electrodes 520 and 540 may be formed.

Hereinafter, a schematic cross-sectional shape of a display device according to an embodiment will be further described with reference to FIG. 6 and FIG. 7.

Figure 6:
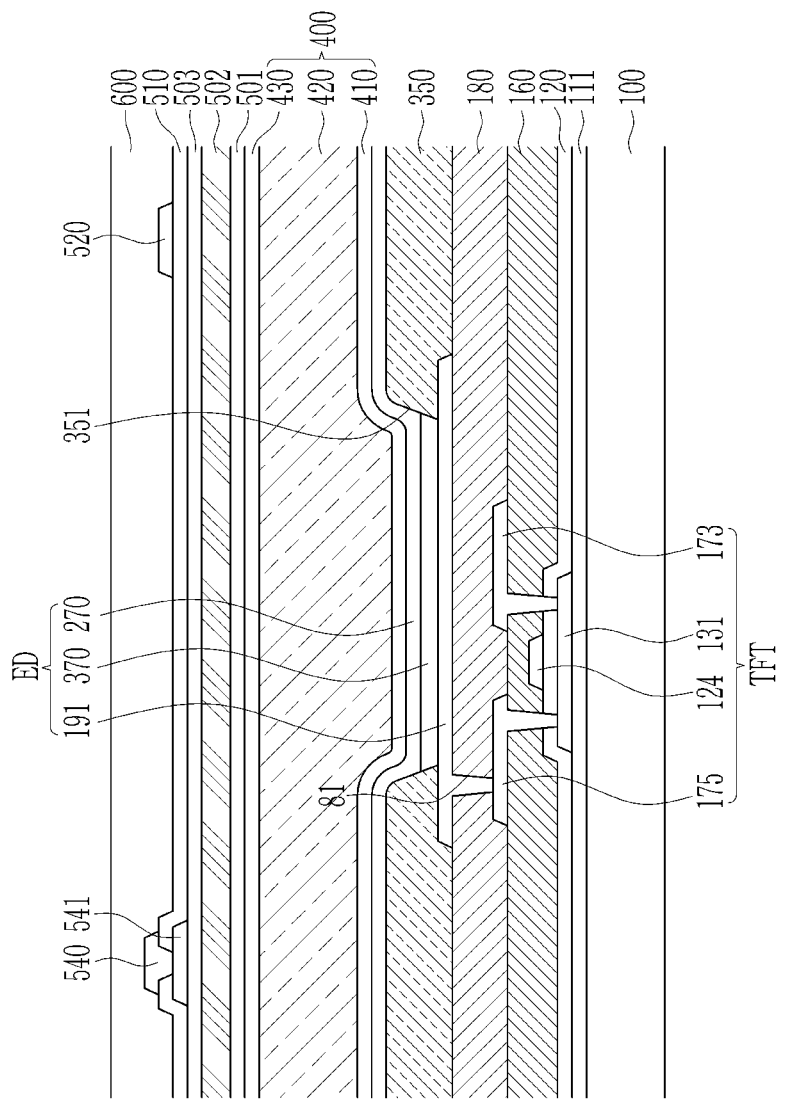
FIG. 6 illustrates a schematic cross-sectional view of a portion of a display area in a display device according to an embodiment.
Figure 7:
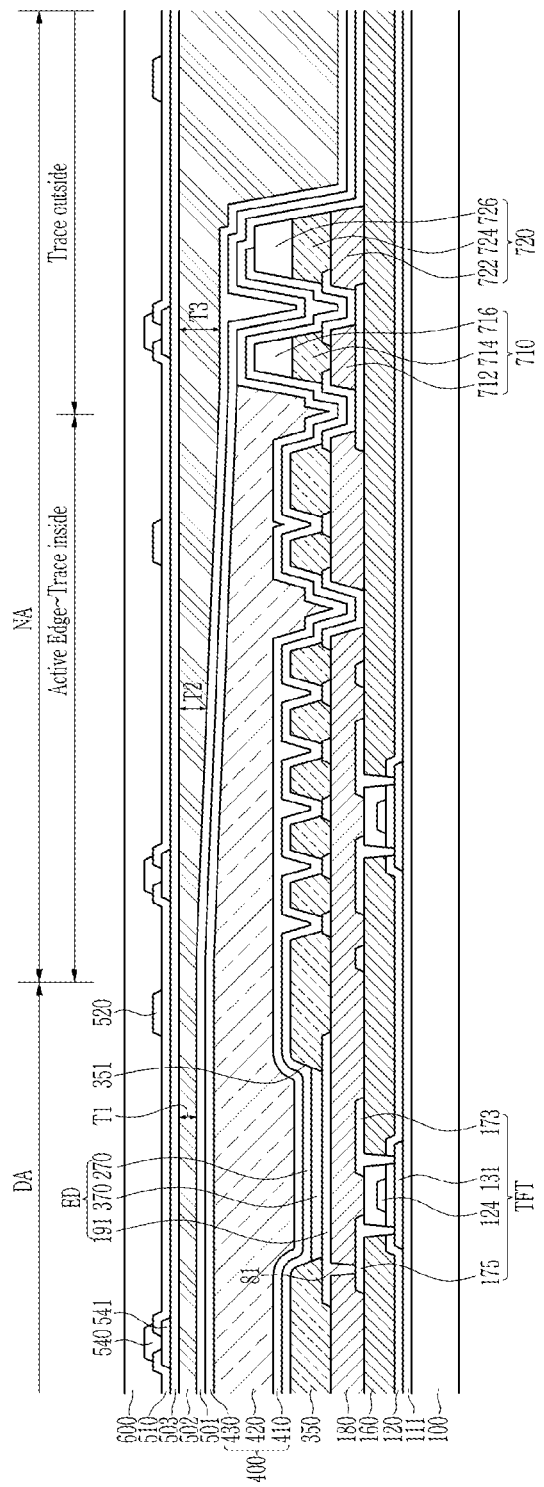
FIG. 7 illustrates a schematic cross-sectional view of portions of a display area and a non-display area in a display device according to an embodiment.

FIG. 6 illustrates a schematic cross-sectional view of a portion of a display area in a display device according to an embodiment, and FIG. 7 illustrates a schematic cross-sectional view of portions of a display area and a non-display area in a display device according to an embodiment. FIG. 7 illustrates a schematic cross-sectional view taken along line VII-VII of FIG. 3.

As shown in FIG. 6, the display area DA of the display device 1000 according to the embodiment may include a substrate 100, a transistor TFT disposed on the substrate 100, a light emitting element ED connected to the transistor TFT, an encapsulation layer 400 disposed on the emitting element ED, a planarization layer 502 disposed on the encapsulation layer 400, and the sensing electrodes 520 and 540 disposed on the planarization layer 502.

The substrate 100 may include a material having a rigid characteristic, such as glass, or a flexible material that may be bent, such as plastic and polyimide. A buffer layer 111 for flattening a surface of the substrate 100 and blocking impure elements from penetrating may be further disposed on the substrate 100. The buffer layer 111 may include an inorganic material, for example, an inorganic insulating material such as a silicon nitride ($SiN_x$), a silicon oxide ($SiO_x$), a silicon oxynitride ($SiO_xN_y$), or the like. The buffer layer 111 may have a single-layered or multi-layered structure of the inorganic material. A barrier layer (not shown) may be further disposed on the substrate 100. The barrier layer may be disposed between the substrate 100 and the buffer layer 111. The barrier layer may include an inorganic insulating material such as a silicon nitride ($SiN_x$), a silicon oxide ($SiO_x$), a silicon oxynitride ($SiO_xN_y$), or the like. The barrier layer BA may have a single-layer or multi-layered structure of the inorganic insulating material.

A semiconductor 131 may be disposed on the buffer layer 111. The semiconductor 131 may include one of an amorphous silicon, a polycrystalline silicon, and an oxide semiconductor. For example, the semiconductor 131 may include a low temperature polycrystalline silicon (LTPS), or an oxide semiconductor material including at least one of zinc (Zn), indium (In), gallium (Ga), tin (Sn), the like, and a mixture thereof. For example, the semiconductor 131 may include an indium-gallium-zinc oxide (IGZO). The semiconductor 131 may include a channel area, a source area, and a drain area that are classified according to whether or not impurity doping is performed. Each of the source area and the drain area may be disposed at sides (e.g., both sides) of the channel area of the semiconductor 131. The source area and the drain area may have a conductive characteristic corresponding to a conductor.

A gate insulating film 120 may be disposed on the semiconductor 131. The gate insulating film 120 may cover the semiconductor 131 and the substrate 100. The gate insulating film 120 may include an inorganic insulating material such as a silicon nitride ($SiN_x$), a silicon oxide ($SiO_x$), a silicon oxynitride ($SiO_xN_y$), or the like. The gate insulating film 120 may have a single-layer or multi-layered structure of the inorganic insulating material described above.

A gate electrode 124 may be disposed on the gate insulating film 120. The gate electrode 124 may include a metal such as copper (Cu), molybdenum (Mo), aluminum (Al), silver (Ag), chromium (Cr), tantalum (Ta), titanium (Ti), the like, or a metal alloy thereof, or a combination thereof. The gate electrode 124 may be formed as a single layer or a multilayer. After forming the gate electrode 124, a doping process or plasma treatment may be performed. A portion of the semiconductor 131 that is covered by the gate electrode 124 may not be doped or plasma-treated, and a portion of the semiconductor 131 that is not covered by the gate electrode 124 may be doped or plasma-treated to be able to have the same characteristic as a conductor. An area of the semiconductor 131 that overlaps the gate electrode 124 in a plan view may be a channel area.

A first interlayer insulating film 160 may be disposed on the gate electrode 124. The first interlayer insulating film 160 may cover the gate electrode 124 and the gate insulating film 120. The first interlayer insulating film 160 may include an inorganic insulating material such as a silicon nitride ($SiN_x$), a silicon oxide ($SiO_x$), a silicon oxynitride ($SiO_xN_y$), or the like. The first interlayer insulating film 160 may have a single-layered or multi-layered structure of the inorganic insulating material described above.

A source electrode 173 and a drain electrode 175 may be disposed on the first interlayer insulating film 160. Each of the source electrode 173 and the drain electrode 175 may be connected to the source area and the drain area of the semiconductor 131 by openings formed in the first interlayer insulating film 160 and the gate insulating film 120. Accordingly, the semiconductor 131, the gate electrode 124, the source electrode 173, and the drain electrode 175, which are described above, may configure one transistor TFT. In some embodiments, the transistor TFT may include the source and drain areas of the semiconductor 131 instead of the source electrode 173 and the drain electrode 175. Although one transistor TFT is illustrated in FIG. 6, each of pixels of the display device 1000 according to the embodiment may include transistors TFT.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), the like, or a metal alloy thereof, or a combination thereof. The source electrode 173 and the drain electrode 175 may be formed as a single layer or a multi-layer. The source electrode 173 and the drain electrode 175 according to the embodiment may be configured of a triple layer including an upper layer, an intermediate layer, and a lower layer, the upper layer and the lower layer may include titanium (Ti), and the intermediate layer may include aluminum (Al).

A second interlayer insulating film 180 may be disposed on the source electrode 173 and the drain electrode 175. The second interlayer insulating film 180 may cover the source electrode 173, the drain electrode 175, and the first interlayer insulating film 160. The second interlayer insulating film 180 may be for planarizing the surface of the substrate 100 provided with the transistor TFT, may be an organic insulating film, and may include one or more of a polyimide, a polyamide, an acryl resin, benzocyclobutene, a phenol resin, and the like.

A pixel electrode 191 may be disposed on the second interlayer insulating layer 180. The pixel electrode 191 may also be referred to as an anode electrode, and may be formed as a single layer or a multilayer that includes a transparent conductive oxide film or a metal material. The transparent conductive oxide film may include an indium tin oxide (ITO), a poly-ITO, an indium zinc oxide (IZO), an indium gallium zinc oxide (IGZO), an indium tin zinc oxide (ITZO), and the like. The metal material may include at least one of silver (Ag), molybdenum (Mo), copper (Cu), gold (Au), and aluminum (Al), the like, or a metal alloy thereof, or the combination thereof.

The second interlayer insulating film 180 may include a via hole 81 exposing the drain electrode 175. The pixel electrode 191 may be physically and electrically connected to the drain electrode 175 through the via hole 81 of the second interlayer insulating layer 180. Accordingly, the pixel electrode 191 may receive an output current to be transmitted from the drain electrode 175 to a light emitting layer 370.

A bank layer 350 may be disposed on the pixel electrode 191 and the second interlayer insulating film 180. The bank layer 350 may also be referred to as a pixel defining layer PDL, and may include a pixel opening 351 overlapping at least a portion of the pixel electrode 191. The pixel opening 351 may overlap a central portion of the pixel electrode 191, and may not overlap an edge portion of the pixel electrode 191. Accordingly, a size of the pixel opening 351 may be smaller than the size of the pixel electrode 191. The bank layer 350 may partition a formation position of the light emitting layer 370 so that the light emitting layer 370 may be disposed on a portion where an upper surface of the pixel electrode 191 is exposed. The bank layer 350 may be an organic insulating film containing one or more of a polyimide, a polyamide, an acryl resin, benzocyclobutene, a phenol resin, and the like. In some embodiments, the bank layer 350 may be formed as a black pixel defining layer BPDL including a black color pigment.

Although not shown, a spacer may be further disposed on the bank layer 350. The spacer and the bank layer 350 may include a same material. However, the disclosure is not limited thereto, and the spacer may be made of a different material from an organic insulating material of the bank layer 350. The spacer may be an organic insulating film containing one or more of a polyimide, a polyamide, an acryl resin, benzocyclobutene, a phenol resin, and the like.

The light emitting layer 370 may be disposed on the pixel electrode 191. The light emitting layer 370 may be disposed within the pixel opening 351 partitioned by the bank layer 350. The light emitting layer 370 may include an organic material that emits red, green, and blue light. The light emitting layer 370 that emits red, green, and blue light may include a low molecular weight or a high molecular weight organic material. Although the light emitting layer 370 is illustrated as a single layer in FIG. 6, auxiliary layers such as an electron injection layer, an electron transport layer, a hole transport layer, and a hole injection layer may be included above and below the light emitting layer 370, a hole injection layer and a hole transport layer may be disposed under the light emitting layer 370, and an electron transport layer and an electron injection layer may be disposed on the light emitting layer 370.

A common electrode 270 may be disposed on the bank layer 350 and the light emitting layer 370. The common electrode 270 may also be referred to as a cathode, and may be formed of a transparent conductive layer including an indium tin oxide (ITO), an indium zinc oxide (IZO), an indium gallium zinc oxide (IGZO), an indium tin zinc oxide (ITZO), and the like. The common electrode 270 may have a translucent characteristic, and may form a micro-cavity together with the pixel electrode 191. According to a structure of the micro-cavity, light with a specific wavelength may be emitted upward by a gap and characteristic between electrodes at ends thereof, and as a result, red, green, and blue colors may be displayed.

The pixel electrode 191, the light emitting layer 370, and the common electrode 270 may configure a light emitting element ED. The pixel electrode 191 may be an anode electrode, which is a hole injection electrode, and the common electrode 270 may be a cathode electrode, which is an electron injection electrode. However, the disclosure is not limited thereto, and the anode electrode and the cathode electrode may be oppositely formed according to a driving method of the display device 1000.

Holes and electrons may be injected into the light emitting layer 370 from the pixel electrode 191 and the common electrode 270, respectively, and excitons generated by coupling the injected holes and electrons may fall from an excited state to a ground state to emit light.

An encapsulation layer 400 may be disposed on the common electrode 270. The encapsulation layer 400 may include at least one inorganic film and at least one organic film. In the embodiment, the encapsulation layer 400 may include a first inorganic encapsulation layer 410, an organic encapsulation layer 420, and a second inorganic encapsulation layer 430. However, this is merely an example, and the number of inorganic and organic films configuring the encapsulation layer 400 may be variously changed. The first inorganic encapsulation layer 410, the organic encapsulation layer 420, and the second inorganic encapsulation layer 430 may be disposed in the display area DA and a portion of the non-display area NA. In some embodiments, the organic encapsulation layer 420 may be formed around the display area DA, and the first inorganic encapsulation layer 410 and the second inorganic encapsulation layer 430 may be formed up to the non-display area NA. The encapsulation layer 400 may be to protect the light emitting element ED from moisture or oxygen that may be introduced from an outside, and end portions of the first inorganic encapsulation layer 410 and the second inorganic encapsulation layer 430 may be formed to contact (e.g., directly contact) each other.

A first buffer layer 501 may be disposed on the encapsulation layer 400. The first buffer layer 501 may be formed as an inorganic insulating film, and an inorganic material included in the inorganic insulating film may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, and the like. In some embodiments, the first buffer layer 501 may be omitted.

A planarization layer 502 may be disposed on the first buffer layer 501. The planarization layer 502 may be made of an organic insulating material, and may include at least one material of a polyimide, a polyamide, an acryl resin, benzocyclobutene, a phenol resin, and the like. The planarization layer 502 may be entirely formed on the substrate 100. In the display area DA, an upper surface of the encapsulation layer 400 may be planarized by the organic encapsulation layer 420. Accordingly, a thickness of the planarization layer 502 in the display area DA may be constant.

A second buffer layer 503 may be disposed on the planarization layer 502. The second buffer layer 503 may be formed as an inorganic insulating film, and an inorganic material included in the inorganic insulating film may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, and the like. In some embodiments, the second buffer layer 503 may be omitted.

The sensing electrode connecting parts 521 and 541, a sensing insulating layer 510, and the sensing electrodes 520 and 540 may be disposed on the second buffer layer 503. One of the first sensing electrode connecting part 521 and the second sensing electrode connecting part 541 may be disposed on a same layer as the sensing electrodes 520 and 540, and the other thereof may be disposed on a different layer from the sensing electrodes 520 and 540. Hereinafter, an example in which the second sensing electrode connecting part 541 may be disposed on a different layer from the sensing electrodes 520 and 540 will be described.

The second sensing electrode connecting part 541, the sensing insulating layer 510, and the sensing electrodes 520 and 540 may configure a sensing sensor. The sensing sensor may be classified into a resistive type, a capacitive type, an electro-magnetic type, an optical type, and the like. The sensing sensor according to the embodiment may use a capacitance type of sensor.

The second sensing electrode connecting part 541 may be disposed on the second buffer layer 503, and the sensing insulating layer 510 may be disposed on the second buffer layer 503 and the second sensing electrode connecting part 541. The sensing insulating layer 510 may include an inorganic insulating material or an organic insulating material. The inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, and the like. The organic insulating material may include at least one of an acryl-based resin, a methacrylic-based resin, a polyisoprene, a vinyl-based resin, an epoxy-based resin, a urethane-based resin, a cellulose-based resin, a perylene-based resin, and the like.

The sensing electrodes 520 and 540 may be disposed on the sensing insulating layer 510. The sensing electrodes 520 and 540 may include first sensing electrodes 520 and second sensing electrodes 540. The first sensing electrode 520 and the second sensing electrode 540 may be electrically insulated from each other. The sensing insulating layer 510 may include an opening exposing an upper surface of the second sensing electrode connecting part 541, and the second sensing electrode connecting part 541 may be connected to the second sensing electrode 540 through the opening of the sensing insulating layer 510 to electrically connect two second sensing electrodes 540 adjacent to each other. The first sensing electrode connecting part 521 for connecting the first sensing electrode 520 may be formed on a same layer as the first sensing electrode 520 and the second sensing electrode 540.

The sensing electrodes 520 and 540 may include a conductive material having good conductivity. For example, the sensing electrodes 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), the like, or a metal alloy thereof, or a combination thereof. The sensing electrodes 520 and 540 may be formed of a single layer or a multilayer. The sensing electrodes 520 and 540 may include openings so that light emitted from the light emitting diode may be emitted upward without interference. In some embodiments, the sensing electrodes 520 and 540 may be configured of a triple layer including an upper layer, an intermediate layer, and a lower layer, the upper layer and the lower layer may include titanium (Ti), and the intermediate layer may include aluminum (Al).

An insulating layer 600 may be disposed on the sensing electrodes 520 and 540 and the sensing insulating layer 510. The insulating layer 600 may include an inorganic insulating material or an organic insulating material. The inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, and the like. The organic insulating material may include at least one of an acryl-based resin, a methacrylic-based resin, a polyisoprene, a vinyl-based resin, an epoxy-based resin, a urethane-based resin, a cellulose-based resin, a perylene-based resin, and the like.

As shown in FIG. 7, the non-display area NA of the display device 1000 according to the embodiment may include the substrate 100, dams 710 and 720 disposed on the substrate 100, the common electrode 270 disposed on the bank layer 350, the encapsulation layer 400 disposed on the common electrode 270, the planarization layer 502 disposed on the encapsulation layer 400, and sensing electrodes 520 and 540 disposed on the planarization layer 502.

The buffer layer 111 may be disposed on the substrate 100, and the dams 710 and 720 may be disposed on the buffer layer 111. However, in some embodiments, the buffer layer 111 may not be disposed in the non-display area NA.

The dams 710 and 720 may include a first dam 710 and a second dam 720. The first dam 710 may be disposed relatively closer to the display area DA than the second dam 720. For example, the second dam 720 may be disposed more outside than the first dam 710. However, the number of the dams is not limited thereto, and may be changed in embodiments. For example, three or more dams may be formed.

The first dam 710 may include a first layer 712, a second layer 714, and a third layer 716. The second layer 714 may be disposed on the first layer 712 of the first dam 710, and the third layer 716 may be disposed on the second layer 714 thereof. The first layer 712 of the first dam 710 and the second interlayer insulating film 180 may be made of a same material, and may be disposed on a same layer. For example, the first layer 712 of the first dam 710 may be formed in a same process as the second interlayer insulating film 180. The second layer 714 of the first dam 710 and the bank layer 350 may be made of (or include) a same material, and may be disposed on a same layer. For example, the second layer 714 of the first dam 710 and the bank layer 350 may be formed in a same process. The third layer 716 of the first dam 710 and the spacer may be made of a same material, and may be disposed on a same layer. For example, the third layer 716 of the first dam 710 may be formed in a same process as the spacer.

The second dam 720 may include a first layer 722, a second layer 724, and a third layer 726. The second layer 724 may be disposed on the first layer 722 of the second dam 720, and the third layer 726 may be disposed on the second layer 724 thereof. The first layer 722 of the second dam 720 and the second interlayer insulating film 180 may be made of a same material, and may be disposed on a same layer. For example, the first layer 722 of the second dam 720 and the second interlayer insulating film 180 may be formed in the same process. The second layer 724 of the second dam 720 and the bank layer 350 may be made of a same material, and may be disposed on a same layer. For example, the second layer 724 of the second dam 720 and the bank layer 350 may be formed in a same process. The third layer 726 of the second dam 720 and the spacer may be made of a same material, and may be disposed on a same layer. For example, the third layer 726 of the second dam 720 and the spacer may be formed in a same process. The second dam 720 and the first interlayer insulating film 160 may further include a layer including a same material.

In the above description, the embodiments in which the first dam 710 and the second dam 720 may have a triple-layered structure has been described, but the disclosure is not limited thereto, and a structure of the first dam 710 and the second dam 720 may be variously changed. For example, the first dam 710 may have a triple-layered structure, and the second dam 720 may have a quadruple-layered structure. As another example, both the first dam 710 and the second dam 720 may have a quadruple-layered structure. As another example, the number of layers configuring the first dam 710 or the second dam 720 may be less or more.

The common electrode 270 may be disposed on the first dam 710 and the second dam 720. The common electrode 270 may be entirely disposed in the display area DA, and may extend to a portion of the non-display area NA. For example, the common electrode 270 may extend from the display area DA to be formed to cover the entire first dam 710 disposed in the non-display area NA and to be formed to cover a portion of the second dam 720. The common electrode 270 may not be disposed outside the second dam 720.

The encapsulation layer 400 may be disposed on the common electrode 270. The first inorganic encapsulation layer 410 and the second inorganic encapsulation layer 430 may be entirely disposed in the display area DA, and may also be entirely disposed in the non-display area NA. For example, the first inorganic encapsulation layer 410 and the second inorganic encapsulation layer 430 may extend from the display area DA to an end portion of the non-display area NA. The organic encapsulation layer 420 may be entirely disposed in the display area DA, and may extend to a portion of the non-display area NA. An end portion of the organic encapsulation layer 420 may reach the first dam 710. The organic encapsulation layer 420 may overlap a portion of the first dam 710. The first dam 710 may control spreading of a material in the process of forming the organic encapsulation layer 420. The organic encapsulation layer 420 may have a shape to fill a space between an end portion of the display area DA and the first dam 710. The organic encapsulation layer 420 may be disposed between the first inorganic encapsulation layer 410 and the second inorganic encapsulation layer 430.

By forming the organic encapsulation layer 420 to not reach the end portion of the display device 1000 as described above, an upper surface of the encapsulation layer 400 may not be flat in the non-display area NA. In the non-display area NA, the upper surface of the encapsulation layer 400 may be gradually lowered as it is away from the display area DA. For example, a thickness of a portion of the encapsulation layer 400 disposed in the non-display area NA may gradually decrease as it is away from the display area DA. The first inorganic encapsulation layer 410 and the second inorganic encapsulation layer 430 may have a uniform thickness as a whole, and a thickness of the organic encapsulation layer 420 may be varied depending on positions thereof. A thickness of a portion of the organic encapsulation layer 420 disposed in the non-display area NA may gradually decrease as it is away from the display area DA.

The first buffer layer 501, the planarization layer 502, and the second buffer layer 503 may be disposed on the encapsulation layer 400. The planarization layer 502 may be disposed on the first buffer layer 501, and the second buffer layer 503 may be disposed on the planarization layer 502. The first buffer layer 501, the planarization layer 502, and the second buffer layer 503 may be entirely disposed in the display area DA, and may also be entirely disposed in the non-display area NA. For example, the first buffer layer 501, the planarization layer 502, and the second buffer layer 503 may extend from the display area DA to an end portion of the non-display area NA.

The planarization layer 502 may be formed by a slit coating method. A coating process may be performed by positioning a nozzle having a shape of a slit on the substrate 100 and discharging droplets while moving from an end portion of the substrate 100 to another end portion thereof. The planarization layer 502 may be formed by curing a coating layer by performing a photo process.

In a typical slit coating process, the coating layer may be thickly formed due to a relatively large amount of droplets at a starting point, and may be formed to have a constant thickness, and may be relatively thinly formed at an end point, and may be thickly formed again. Immediately after depositing the droplets, an upper surface of the coating layer may be flattened by a bottom surface of the nozzle or a separate planarization member, and a difference in thickness of the coating layer may be reduced. For example, the upper surface of the planarization layer 502 may be formed to be flat. Also, as described above, heights of the upper surfaces of the encapsulation layer 400 may be different in the display area DA and the non-display area NA, but by forming the planarization layer 502, the heights of the upper surfaces of the planarization layer 502 in the display area DA and the non-display area NA may be constant. Accordingly, the upper surface of the planarization layer 502 may be formed to be flat. A height of an upper surface of each layer may mean a distance from the substrate 100. In the non-display area NA, the thickness of the encapsulation layer 400 may gradually decrease as it is away from the display area DA, and on the contrary, the thickness of the planarization layer 502 may gradually increase. For example, the thickness of the organic encapsulation layer 420 may be gradually decreased corresponding to a portion in which the thickness of the planarization layer 502 is gradually increased. At an end portion of the substrate 100, the thickness of the planarization layer 502 may be the thickest. For example, a thickness T1 of the planarization layer 502 in the display area DA may be about 4 μm, a thickness T2 of the planarization layer 502 in a portion (Active Edge-Trace inside) of the non-display area NA adjacent to the display area DA may be about 6 μm, and a thickness T3 of the planarization layer 502 in a portion (Trace outside) of the non-display area NA far from the display area DA may be about 9 μm. However, this is merely an example, and the thickness of the planarization layer 502 may be designed to be variously changed.

Hereinafter, a relationship between a thickness of the planarization layer 502 and flatness of the upper surface of the planarization layer 502 will be described with reference to FIG. 8.

Figure 8:
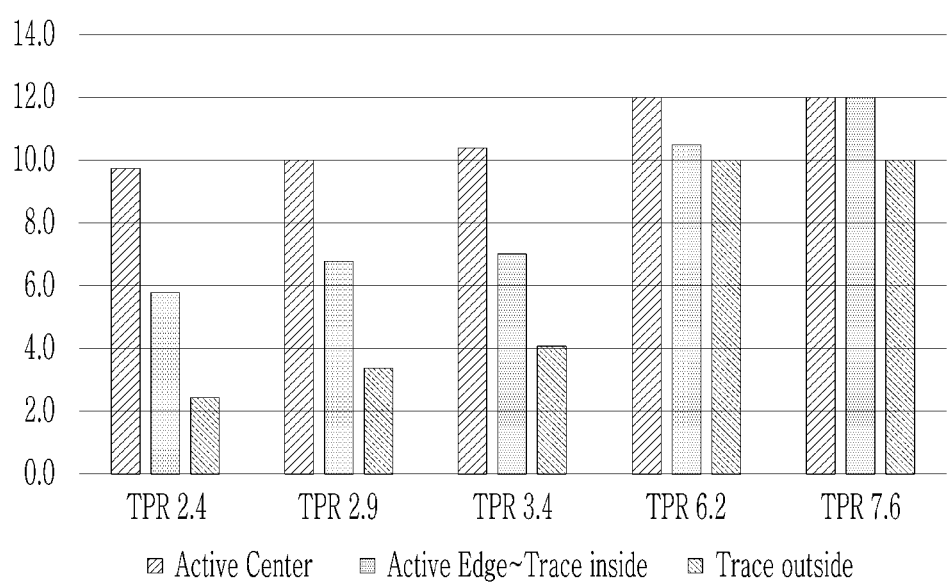
FIG. 8 illustrates a graph of a sum of thicknesses of an organic encapsulation layer and a planarization layer according to a thickness of the planarization layer.

FIG. 8 illustrates a graph of a sum of thicknesses of the organic encapsulation layer and the planarization layer according to a thickness of the planarization layer. FIG. 8 shows an embodiment in which, at an edge of the non-display area NA, the thickness of the planarization layer 502 is about 2.4 μm (TPR 2.4), about 2.9 μm (TPR 2.9), about 3.4 μm (TPR 3.4), about 6.2 μm (TPR 6.2), and about 7.6 μm (TPR 7.6), respectively.

As shown in FIG. 8, in case that the thickness of the planarization layer 502 at the edge of the non-display area NA is about 2.4 μm (TPR 2.4), a sum of the thicknesses of the organic encapsulation layer 420 and the planarization layer 502 in the center (Active Center) of the display area DA may be about 9.8 μm. A sum of the thicknesses of the organic encapsulation layer 420 and the planarization layer 502 in the portion (Active Edge-Trace inside) of the non-display area NA adjacent to the display area DA may be about 5.8 μm. A sum of the thicknesses of the organic encapsulation layer 420 and the planarization layer 502 in the portion (Trace outside) of the non-display area NA far from the display area DA may be about 2.4 μm.

In case that the thickness of the planarization layer 502 at the edge of the non-display area NA is about 2.9 μm (TPR 2.9), a sum of the thicknesses of the organic encapsulation layer 420 and the planarization layer 502 in the center (Active Center) of the display area DA may be about 10 μm. A sum of the thicknesses of the organic encapsulation layer 420 and the planarization layer 502 in the portion (Active Edge-Trace inside) of the non-display area NA adjacent to the display area DA may be about 6.8 μm. A sum of the thicknesses of the organic encapsulation layer 420 and the planarization layer 502 in the portion (Trace outside) of the non-display area NA far from the display area DA may be about 3.4 μm.

In case that the thickness of the planarization layer 502 at the edge of the non-display area NA is about 3.4 μm (TPR 3.4), a sum of the thicknesses of the organic encapsulation layer 420 and the planarization layer 502 in the center (Active Center) of the display area DA may be about 10.4 μm. A sum of the thicknesses of the organic encapsulation layer 420 and the planarization layer 502 in the portion (Active Edge-Trace inside) of the non-display area NA adjacent to the display area DA may be about 7 μm. A sum of the thicknesses of the organic encapsulation layer 420 and the planarization layer 502 in the portion (Trace outside) of the non-display area NA far from the display area DA may be about 4 μm.

In case that the thickness of the planarization layer 502 at the edge (Trace outside) of the non-display area NA is about 6.2 μm (TPR 6.2), a sum of the thicknesses of the organic encapsulation layer 420 and the planarization layer 502 in the center (Active Center) of the display area DA may be about 12 μm. A sum of the thicknesses of the organic encapsulation layer 420 and the planarization layer 502 in the portion (Active Edge-Trace inside) of the non-display area NA adjacent to the display area DA is about 10.5 μm. A sum of the thicknesses of the organic encapsulation layer 420 and the planarization layer 502 in the portion (Trace outside) of the non-display area NA far from the display area DA may be about 10 μm.

In case that the thickness of the planarization layer 502 at the edge of the non-display area NA is about 7.6 μm (TPR 7.6), a sum of the thicknesses of the organic encapsulation layer 420 and the planarization layer 502 in the center (Active Center) of the display area DA may be about 12 μm. A sum of the thicknesses of the organic encapsulation layer 420 and the planarization layer 502 in the portion (Active Edge-Trace inside) of the non-display area NA adjacent to the display area DA is about 12 μm. A sum of the thicknesses of the organic encapsulation layer 420 and the planarization layer 502 in the portion (Trace outside) of the non-display area NA far from the display area DA may be about 10 μm.

The sum of the thicknesses of the organic encapsulation layer 420 and the planarization layer 502 in each area may affect the flatness of the upper surface of the planarization layer 502. As a difference between the sums of the thicknesses of the organic encapsulation layer 420 and the planarization layer 502 increases for each area, the flatness of the upper surface of the planarization layer 502 may be decreased. Conversely, as the sums of the thicknesses of the organic encapsulation layer 420 and the planarization layer 502 are constant for each of areas, the flatness of the upper surface of the planarization layer 502 may be increased.

At the edge of the non-display area NA, in case that the thickness of the planarization layer 502 is about 2.4 μm (TPR 2.4), about 2.9 μm (TPR 2.9), and about 3.4 μm (TPR 3.4), it may be seen that a difference in the sums of the thicknesses of the organic encapsulation layer 420 and the planarization layer 502 for each area is about 3 μm or more, thus the flatness of the upper surface of the planarization layer 502 is relatively low. At the edge of the non-display area NA, in case that the thickness of the planarization layer 502 is about 6.2 μm (TPR 6.2) and about 7.6 μm (TPR 7.6), it may be seen that the difference in the sums of the thicknesses of the organic encapsulation layer 420 and the planarization layer 502 for each area is about 2 μm or less, thus the flatness of the upper surface of the planarization layer 502 is relatively high. Accordingly, in case that the thickness of the planarization layer 502 is about 6 μm or more at the edge of the non-display area NA, the flatness of the upper surface of the planarization layer 502 may be effectively improved.

Referring back to FIG. 7, the second sensing electrode connecting part 541, the sensing insulating layer 510, and the sensing electrodes 520 and 540 may be disposed on the second buffer layer 503. The second sensing electrode connecting part 541 may be disposed on the second buffer layer 503, and the sensing insulating layer 510 may be disposed on the second buffer layer 503 and the second sensing electrode connecting part 541. The sensing electrodes 520 and 540 may be disposed on the sensing insulating layer 510. An insulating layer 600 may be disposed on the sensing electrodes 520 and 540 and the sensing insulating layer 510.

At least some of the sensing electrodes 520 and 540 disposed in the non-display area NA may be a dummy sensing electrode. The dummy sensing electrode may have a shape similar to the sensing electrodes configuring the sensing sensor but may not substantially function as the sensing sensor.

In the display device 1000 according to the embodiment, since the organic encapsulation layer 420 is not formed in at least a portion of the non-display area NA, the upper surface of the encapsulation layer 400 may not be flat. In case that the sensing sensor is formed directly on the encapsulation layer 400, parasitic capacitance may increase at a portion in which a distance between the sensing sensor and the common electrode 270 is relatively short, and thus touch sensitivity may decrease. In the display device 1000 according to the embodiment, by disposing the planarization layer 502 between the encapsulation layer 400 and the sensing sensor, a distance between various elements including the common electrode 270 and the sensing sensor may be constantly maintained. For example, the upper surface of the planarization layer 502 may be flat in most areas, and a distance between the sensing electrodes 520 and 540 and the common electrode 270 disposed on the planarization layer 502 may be substantially constant. Accordingly, it may be possible to reduce a difference in the parasitic capacitance according to a position of the display device 1000 in a plan view and improve the touch sensitivity.

Although the embodiment in which the organic encapsulation layer 420 may not be formed in at least a portion of the non-display area NA has been described above, in the display device 1000 according to the embodiment, the organic encapsulation layer 420 may not be formed in at least a portion of the opening periphery area LA. For example, the organic encapsulation layer 420 may not be formed from a point (e.g., a predetermined or selectable point) of the opening periphery area LA to the opening area DTA. The thickness of the portion of the organic encapsulation layer 420 disposed in the opening periphery area LA may gradually decrease as it approaches the opening area DTA. Accordingly, there may be a portion in which the upper surface of the encapsulation layer 400 is not flat even in the opening periphery area LA. The planarization layer 502 may be disposed between the encapsulation layer 400 and the sensing sensor. The thickness of the portion of the planarization layer 502 disposed in the opening periphery area LA may gradually increase as it approaches the opening area DTA. Accordingly, the distance between various elements including the common electrode 270 and the sensing sensor may be constantly maintained. Accordingly, it may be possible to reduce the difference in the parasitic capacitance according to the position of the display device 1000 in a plan view and improve the touch sensitivity.

Hereinafter, a display device according to another embodiment will be described with reference to FIG. 9 and FIG. 10.

Figure 9:
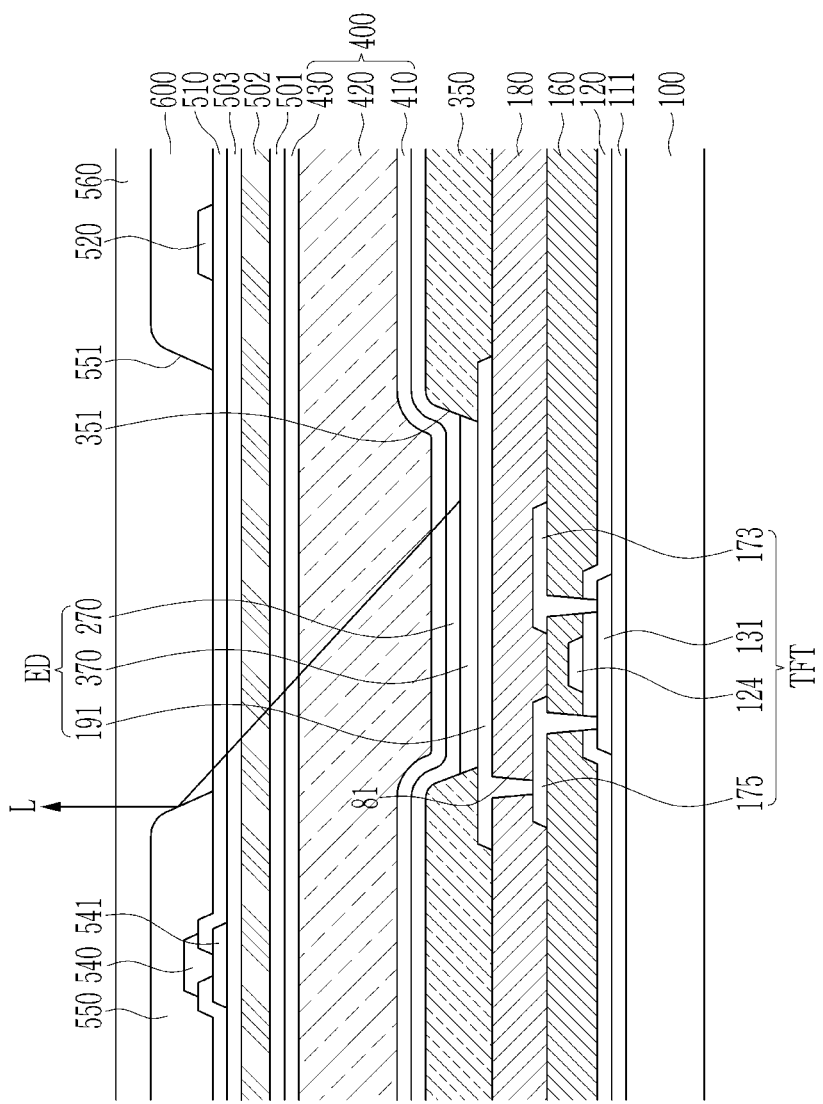
FIG. 9 illustrates a schematic cross-sectional view of a portion of a display area in a display device according to another embodiment.
Figure 10:
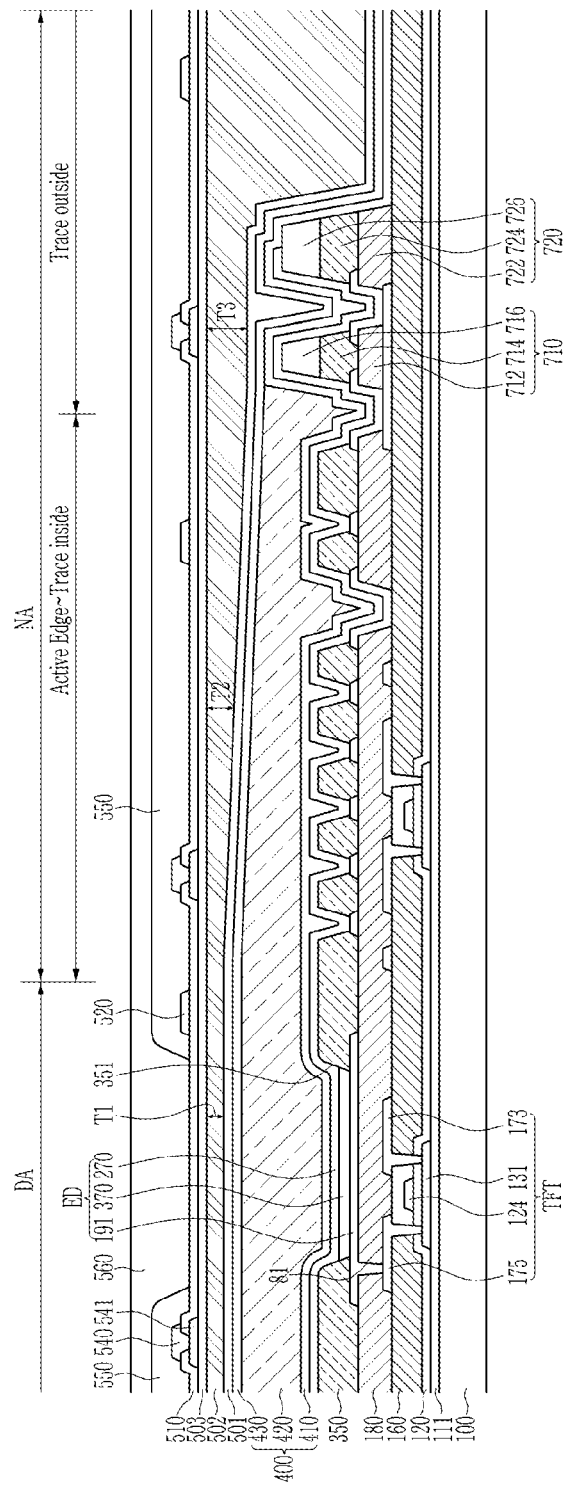
FIG. 10 illustrates a schematic cross-sectional view of portions of a display area and a non-display area in a display device according to another embodiment.

Since many portions of the display device 1000 according to the embodiment shown in FIG. 9 and FIG. 10 are a same as those of the display device 1000 according to the embodiment shown in FIG. 1 to FIG. 7, a repeated description thereof will be omitted. The embodiment is different from the previous embodiment in that a first insulating layer 550 and a second insulating layer 560 having different refractive indexes may be further disposed on the sensing sensor, and differences will be mainly described below.

FIG. 9 illustrates a schematic cross-sectional view of a portion of a display area in a display device according to another embodiment, and FIG. 10 illustrates a schematic cross-sectional view of portions of a display area and a non-display area in a display device according to another embodiment.

As shown in FIG. 9 and FIG. 10, the display device 1000 according to the embodiment may include the substrate 100, the transistor TFT disposed on the display area DA of the substrate 100, the light emitting element ED connected to the transistor TFT, the dams 710 and 720 disposed on the non-display area NA of the substrate 100, the encapsulation layer 400 disposed on the light emitting element ED and the dams 710 and 720, the planarization layer 502 disposed on the encapsulation layer 400, and the sensing electrodes 520 and 540 disposed on the planarization layer 502.

The encapsulation layer 400 may include the first inorganic encapsulation layer 410, the organic encapsulation layer 420, and the second inorganic encapsulation layer 430, and the organic encapsulation layer 420 may be entirely disposed in the display area DA, and may extend to a portion of the non-display area NA. For example, an end portion of the organic encapsulation layer 420 may reach the first dam 710. A thickness of a portion of the organic encapsulation layer 420 disposed in the non-display area NA may gradually decrease as it is away from the display area DA. Accordingly, the upper surface of the encapsulation layer 400 may not be flat in some areas.

The thickness of the portion of the planarization layer 502 disposed in the non-display area NA may be thicker than the thickness of the portion of the planarization layer 502 disposed in the display area DA. The planarization layer 502 may be formed to be relatively thick in a portion in which the organic encapsulation layer 420 has a relatively thin thickness and in a portion in which the organic encapsulation layer 420 is not formed. The thickness of the portion of the planarization layer 502 disposed in the non-display area NA may gradually increase as it is away from the display area DA. The sum of the thicknesses of the organic encapsulation layer 420 and the planarization layer 502 may be almost constant in most positions. The sum of the thicknesses of the encapsulation layer 400 and the planarization layer 502 may be almost constant in most positions. Accordingly, the upper surface of the planarization layer 502 may be flat, and the distance between the sensing electrodes 520 and 540 and the common electrode 270 disposed on the planarization layer 502 may be substantially constant. Accordingly, it may be possible to reduce the difference in the parasitic capacitance according to the position of the display device 1000 in a plan view and improve the touch sensitivity.

A first insulating layer 550 may be disposed on the sensing electrodes 520 and 540. The first insulating layer 550 may be disposed on the sensing insulating layer 510. The first insulating layer 550 may include a light transmitting organic insulating material having a low refractive index. For example, the first insulating layer 550 may include an acrylic resin, a polyimide resin, a polyimide resin, $Alq_3$[Tris(8-hydroxyquinolinato)aluminum], and the like. The first insulating layer 550 may have a relatively smaller refractive index than a second insulating layer 560, which will be described below. For example, the first insulating layer 550 may have a refractive index in a range of about 1.40 to about 1.59.

The first insulating layer 550 may include an opening 551. The opening 551 may mean a portion in which the sensing insulating layer 510 is not covered by the first insulating layer 550. The opening 551 of the first insulating layer 550 may overlap the pixel opening 351. A planar shape of the pixel opening 351 may be similar to a planar shape of the opening 551 of the first insulating layer 550. The pixel opening 351 may have a substantially polygonal shape in a plan view. The pixel opening 351 may be disposed inside the opening 551 of the first insulating layer 550 in a plan view. For example, a size of the opening 551 of the first insulating layer 550 may be larger than that the size of the pixel opening 351. The opening 551 may be formed in the display area DA but may not be formed in the non-display area NA. Accordingly, the first insulating layer 550 may be entirely disposed in the non-display area NA. For example, in the non-display area, the first insulating layer 550 may entirely cover the sensing insulating layer 510.

The second insulating layer 560 may be disposed on the sensing insulating layer 510 and the first insulating layer 550. The second insulating layer 560 may include a light transmitting organic insulating material having a high refractive index. The second insulating layer 560 may have a relatively larger refractive index than the first insulating layer 550. For example, the second insulating layer 560 may have a refractive index in a range of about 1.60 to about 1.80.

The second insulating layer 560 may be disposed in the opening 551 of the first insulating layer 550. The second insulating layer 560 may contact a side surface of the first insulating layer 550. Furthermore, the second insulating layer 560 may be disposed on an upper surface of the first insulating layer 550 so as to contact the upper surface of the first insulating layer 550.

Light L generated from the light emitting layer 370 may emit light in various directions, and may be incident on the sensing area SA (see, e.g., FIG. 5) with various incident angles. At least a portion of the light L incident on the second insulating layer 560 of the sensing area SA may be reflected at an interface between the first insulating layer 550 and the second insulating layer 560. In case that an incident angle of the light L incident on the second insulating layer 560 is larger than a threshold angle, the incident light L may be totally reflected on the interface between the first insulating layer 550 and the second insulating layer 560. For example, as the light L incident on the second insulating layer 560 having a relatively large refractive index proceeds to the first insulating layer 550 having a relatively small refractive index, total reflection may occur at the interface between the first insulating layer 550 and the second insulating layer 560. At least a portion of the light generated by the light emitting element ED may be totally reflected at the interface between the first insulating layer 550 and the second insulating layer 560 to be focused in the front side. Therefore, it may be possible to improve front visibility and light output efficiency of the display device 1000 according to the embodiment.

Hereinafter, a display device according to another embodiment will be described with reference to FIG. 11 and FIG. 12.

Figure 11:
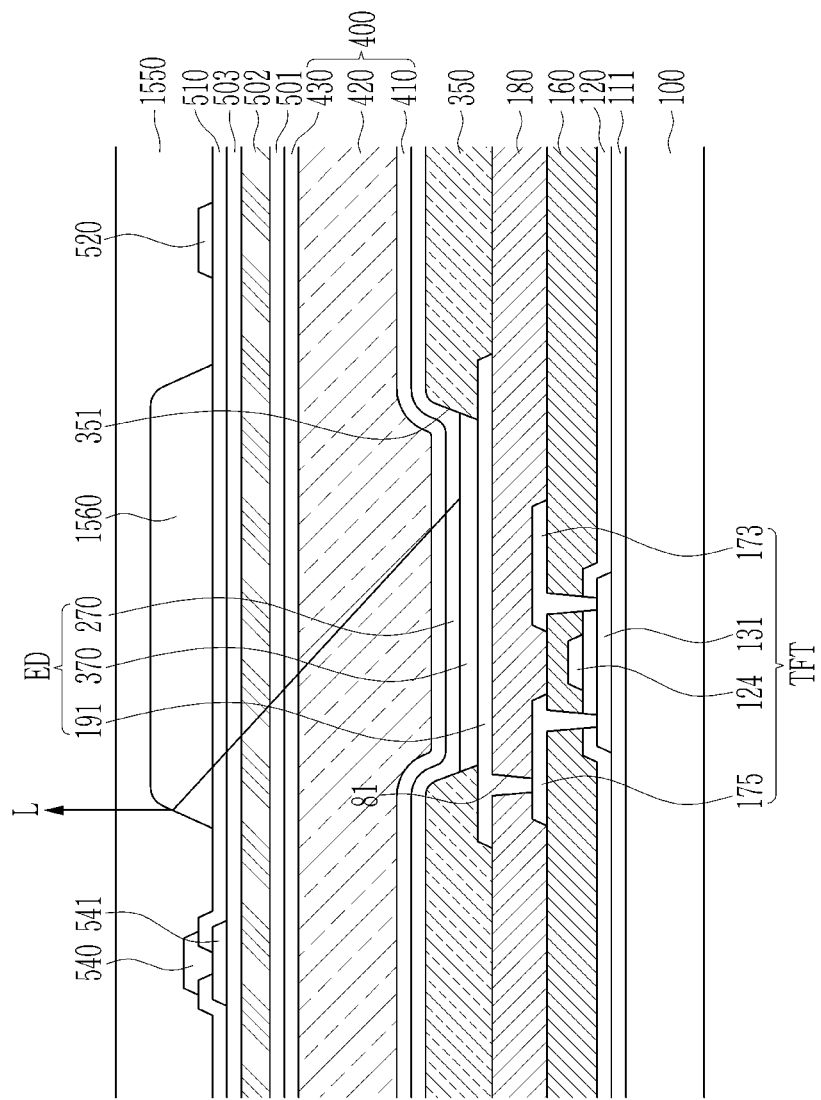
FIG. 11 illustrates a schematic cross-sectional view of a portion of a display area in a display device according to another embodiment.
Figure 12:
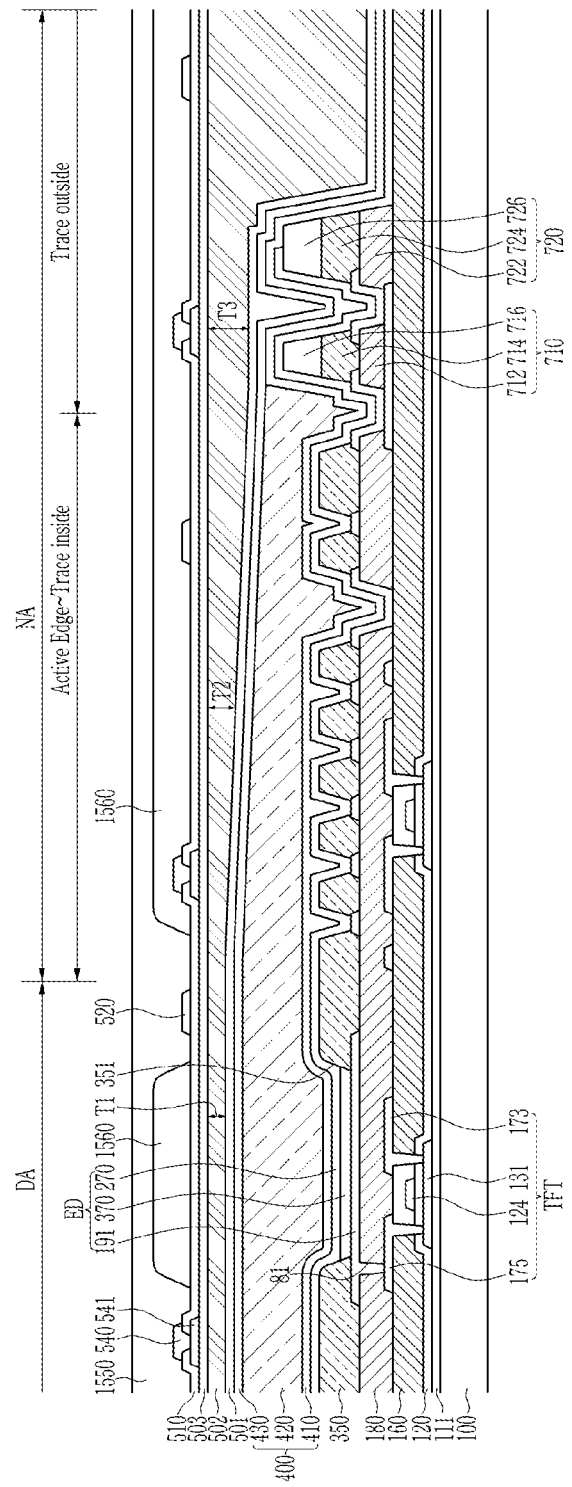
FIG. 12 illustrates a schematic cross-sectional view of portions of a display area and a non-display area in a display device according to another embodiment.

Since many portions of the display device 1000 according to the embodiment shown in FIG. 11 and FIG. 12 are a same as those of the display device 1000 according to the embodiment shown in FIG. 1 to FIG. 7, a repeated description thereof will be omitted. The embodiment is different from the previous embodiment in that a first insulating layer 1560 and a second insulating layer 1550 having different refractive indexes may be further disposed on the sensing sensor, and differences will be mainly described below.

FIG. 11 illustrates a schematic cross-sectional view of a portion of a display area in a display device according to another embodiment, and FIG. 12 illustrates a schematic cross-sectional view of portions of a display area and a non-display area in a display device according to another embodiment.

As shown in FIG. 11 and FIG. 12, the display device 1000 according to the embodiment may include the substrate 100, the transistor TFT disposed on the display area DA of the substrate 100, the light emitting element ED connected to the transistor TFT, the dams 710 and 720 disposed on the non-display area NA of the substrate 100, the encapsulation layer 400 disposed on the light emitting element ED and the dams 710 and 720, the planarization layer 502 disposed on the encapsulation layer 400, and the sensing electrodes 520 and 540 disposed on the planarization layer 502.

The encapsulation layer 400 may include the first inorganic encapsulation layer 410, the organic encapsulation layer 420, and the second inorganic encapsulation layer 430, and the organic encapsulation layer 420 may not be formed in at least some areas, and thus an upper surface of the encapsulation layer 400 may not be flat in at least some areas. A thickness of a portion of the organic encapsulation layer 420 disposed in the non-display area NA may gradually decrease as it is away from the display area DA.

The planarization layer 502 may be formed to be relatively thick in a portion in which the organic encapsulation layer 420 has a relatively thin thickness and in a portion in which the organic encapsulation layer 420 is not formed. The thickness of the portion of the planarization layer 502 disposed in the non-display area NA may gradually increase as it is away from the display area DA. Accordingly, the upper surface of the planarization layer 502 may be formed to be flat, and the touch sensitivity of the sensing sensor disposed on the planarization layer 502 may be improved.

The sensing insulating layer 510 may be disposed on the planarization layer 502, and a first insulating layer 1560 may be disposed on the sensing insulating layer 510. The first insulating layer 1560 may include a light transmitting organic insulating material having a high refractive index. The refractive index of the first insulating layer 1560 may be adjusted according to a functional group included in a layer. As another example, the refractive index of the first insulating layer 1560 may be adjusted according to a type and content of nanoparticles included in the first insulating layer 1560. The first insulating layer 1560 may have a relatively larger refractive index than a second insulating layer 1550, which will be described below. The first insulating layer 1560 may overlap the pixel opening 351 in the display area DA. A planar shape of the first insulating layer 1560 may be similar to the shape of the pixel opening 351. A size of the first insulating layer 1560 may be similar to or larger than the size of the pixel opening 351. The first insulating layer 1560 may be entirely disposed in the non-display area NA. For example, in the non-display area NA, the first insulating layer 1560 may entirely cover the sensing insulating layer 510.

The second insulating layer 1550 may be disposed on the sensing insulating layer 510, the sensing electrodes 520 and 540, and the first insulating layer 1560. The second insulating layer 1550 may include a light transmitting organic insulating material having a low refractive index. The second insulating layer 1550 may include an acrylic resin, a polyimide resin, a polyimide resin, Alq$_3$[Tris(8-hydroxyquinolinato)aluminum], and the like. The second insulating layer 1550 may have a relatively smaller refractive index than the first insulating layer 1560. The second insulating layer 1550 may be formed to cover an upper surface and a side surface of the first insulating layer 1560.

The light L generated from the light emitting layer 370 may emit light in various directions, and may be incident on the sensing area SA (see. e.g., FIG. 5) with various incident angles. At least a portion of the light L incident on the first insulating layer 1560 of the sensing area SA may be refracted at an interface between the first insulating layer 1560 and the second insulating layer 1550. The light refracted while passing through the side surface of the first insulating layer 1560 may pass through the second insulating layer 1550 to be emitted to a front. Therefore, it may be possible to improve the front visibility and the light output efficiency of the display device 1000 according to the embodiment.

Hereinafter, a display device according to another embodiment will be described with reference to FIG. 13 and FIG. 14.

Figure 13:
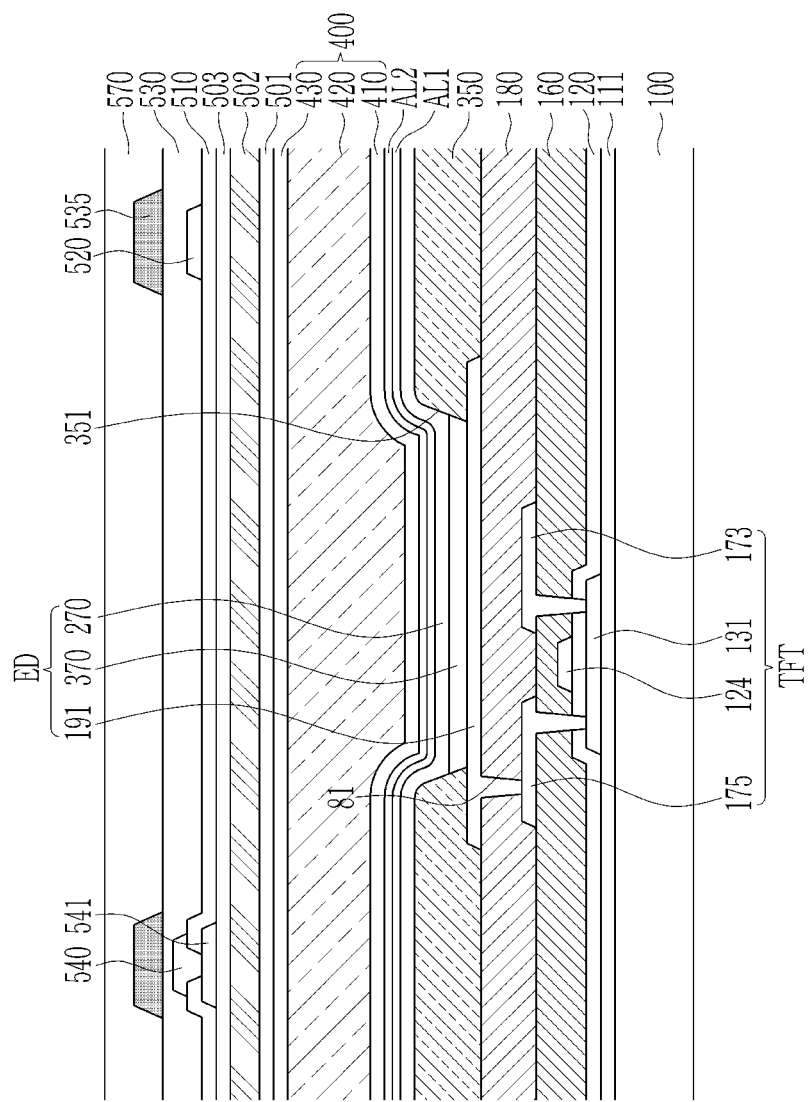
FIG. 13 illustrates a schematic cross-sectional view of a portion of a display area in a display device according to another embodiment.
Figure 14:
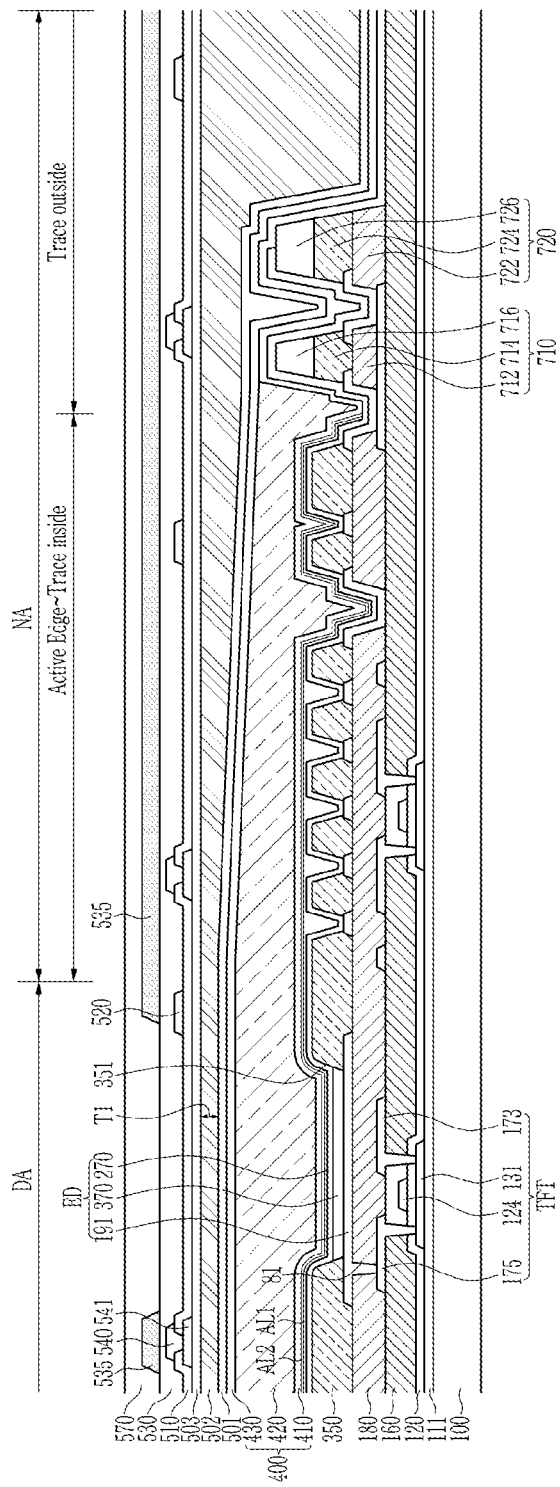
FIG. 14 illustrates a schematic cross-sectional view of portions of a display area and a non-display area in a display device according to another embodiment.

Since many portions of the display device 1000 according to the embodiment shown in FIG. 13 and FIG. 14 are a same as those of the display device 1000 according to the embodiment shown in FIG. 1 to FIG. 7, a repeated description thereof will be omitted. The embodiment is different from the previous embodiment in that a reflection adjusting layer 570 may be further disposed on the sensing sensor, and differences will be mainly described below.

FIG. 13 illustrates a schematic cross-sectional view of a portion of a display area in a display device according to another embodiment, and FIG. 14 illustrates a schematic cross-sectional view of portions of a display area and a non-display area in a display device according to another embodiment.

As shown in FIG. 13 and FIG. 14, the display device 1000 according to the embodiment may include the substrate 100, the transistor TFT disposed on the display area DA of the substrate 100, the light emitting element ED connected to the transistor TFT, the dams 710 and 720 disposed on the non-display area NA of the substrate 100, the encapsulation layer 400 disposed on the light emitting element ED and the dams 710 and 720, the planarization layer 502 disposed on the encapsulation layer 400, and the sensing electrodes 520 and 540 disposed on the planarization layer 502.

The encapsulation layer 400 may include the first inorganic encapsulation layer 410, the organic encapsulation layer 420, and the second inorganic encapsulation layer 430, and the organic encapsulation layer 420 may not be formed in at least some areas, and thus an upper surface of the encapsulation layer 400 may not be flat in at least some areas. A thickness of a portion of the organic encapsulation layer 420 disposed in the non-display area NA may gradually decrease as it is away from the display area DA.

The planarization layer 502 may be formed to be relatively thick in a portion in which the organic encapsulation layer 420 has a relatively thin thickness and in a portion in which the organic encapsulation layer 420 is not formed. The thickness of the portion of the planarization layer 502 disposed in the non-display area NA may gradually increase as it is away from the display area DA. Accordingly, the upper surface of the planarization layer 502 may be formed to be flat, and the touch sensitivity of the sensing sensor disposed on the planarization layer 502 may be improved.

The display device 1000 according to the embodiment may further include a capping layer AL1 and a low reflective layer AL2 disposed on the light emitting element ED.

The capping layer AL1 may serve to improve a luminous efficiency of the light emitting element ED according to a principle of constructive interference. The capping layer AL1 may include, for example, a material having a refractive index of about 1.6 or more with respect to light having a wavelength of about 589 nm.

The capping layer AL1 may be an organic capping layer including an organic material, an inorganic capping layer including an inorganic material, or a composite capping layer including an organic material and an inorganic material. For example, the capping layer AL1 may include a carbocyclic compound, a heterocyclic compound, an amine group-containing compound, porphyrin derivatives, phthalocyanine derivatives, naphthalocyanine derivatives, an alkali metal complex, an alkaline earth metal complex, the like, or a combination thereof. The carbocyclic compound, the heterocyclic compound, and the amine group-containing compound may be selectively substituted with a substituent including O, N, S, Se, Si, F, Cl, Br, I, the like, or a combination thereof.

The low reflective layer AL2 may be disposed on the capping layer AL1. Since the capping layer AL1 may be disposed on the light emitting element ED, it may be said that the low reflective layer AL2 is disposed on the light emitting element ED. The low reflective layer AL2 may overlap most of the substrate 100.

The low reflective layer AL2 may include an inorganic material having low reflectance, and for example, may include a metal or a metal oxide. In case that the low reflective layer AL2 may include the metal, for example, it may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), the like, or a metal alloy thereof, or a combination thereof. In case that the low reflective layer AL2 may include the metal oxide, it may include, for example, $SiO_2$, $TiO_2$, $ZrO_2$, $Ta_2O_5$, $HfO_2$, $Al_2O_3$, $ZnO$, $Y_2O_3$, $BeO$, $MgO$, $PbO_2$, $WO_3$, $SiN_x$, $LiF$, $CaF_2$, $MgF_2$, $CdS$, the like, or a combination thereof.

In the embodiment, an absorption coefficient (k) of the inorganic material included in the low reflective layer AL2 may be in a range of about 4.0 or less and about 0.5 or more ($0.5 < k \geq 4.0$). The inorganic material included in the low reflective layer AL2 may have a refractive index (n) in a range of about 1 or more ($n \geq 1.0$).

The low reflective layer AL2 may induce destructive interference between the light incident inside the display device 1000 and the light reflected from the metal disposed under the low reflective layer AL2, thereby reducing external light reflectivity. Accordingly, it may be possible to improve the display quality and visibility of the display device 1000 by reducing the external light reflectance of the display device 1000 through the low reflective layer AL2.

An insulating layer 530 may be disposed on the sensing insulating layer 510 and the sensing electrodes 520 and 540.

The insulating layer 530 may be entirely disposed in the display area DA and the non-display area NA. The insulating layer 530 may include an inorganic insulating material or an organic insulating material.

A light blocking layer 535 may be disposed on the insulating layer 530. The light blocking layer 535 may overlap the sensing electrodes 520 and 540. The light blocking layer 535 may be disposed at a boundary between pixels in the display area DA. The light blocking layer 535 may be entirely disposed in the non-display area NA. The light blocking layer 535 may be made of a light blocking material, may prevent color mixing at the boundary between pixels, and may prevent light leakage in the non-display area NA.

A reflection adjusting layer 570 may be disposed on the insulating layer 530 and the light blocking layer 535. The reflection adjusting layer 570 may be entirely disposed in the display area DA and the non-display area NA. The reflection adjusting layer 570 may include an organic insulating material, and may further include a dye, pigment, or a combination thereof. For example, the reflection adjusting layer 570 may be formed of an organic film in which a dye or pigment is dispersed. The dye or pigment may reduce reflectance of external light by absorbing light of a certain wavelength, and may adjust a color of a screen displayed by the display device 1000.

For example, the reflection adjusting layer 570 may absorb a first wavelength region in a range of about 490 nm to about 505 nm and a second wavelength region in a range of about 585 nm to about 600 nm, so that it may have light transmittance in a range of about 40% or less in the first wavelength region and the second wavelength region. The reflection adjusting layer 570 may absorb light of a wavelength that is out of a red, green, or blue light emitting wavelength range emitted from the light emitting element ED. As such, since the reflection adjusting layer 570 absorbs light of a wavelength that is not included in the wavelength range of red, green, or blue emitted from the light emitting element, it may be possible to prevent or minimize a decrease in the luminance of the display device 1000, and at the same time, it may be possible to prevent or minimize a decrease in the luminous efficiency of the display device 1000 and to improve visibility.

In the embodiment, the reflection adjusting layer 570 may be provided as an organic material layer including a dye, pigment, or a combination thereof. The reflection adjusting layer 570 may include an acryl-based compound, a tetraazaporphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, the like, or a combination thereof.

For example, the reflection adjusting layer 570 may include a compound represented by one of Chemical Formula 1 to Chemical Formula 4 below. Chemical Formula 1 to Chemical Formula 4 may have a chromophore structure corresponding to some of the compounds described above. Chemical Formula 1 to Chemical Formula 4 are merely examples, and the disclosure is not limited thereto.

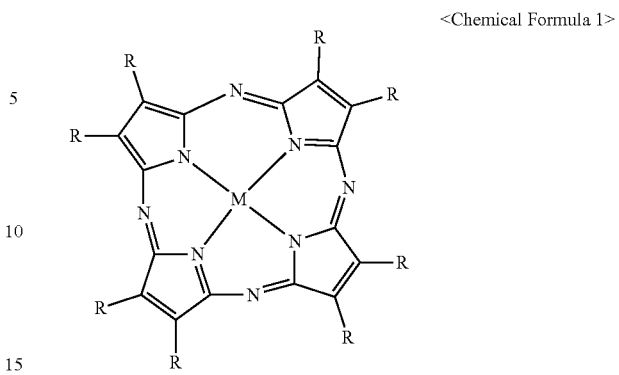

<Chemical Formula 1>

<Chemical Formula 2>

<Chemical Formula 3>

<Chemical Formula 4>

In Chemical Formula 1 to Chemical Formula 4,

M may be a metal;

$X^-$ may be a monovalent negative ion; and

Rs may be a same as or different from each other, and each may be hydrogen, deuterium (-D), —F, —Cl, —Br, —I, a hydroxyl group, a cyano group, or a nitro group; deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a $C_1$-$C_{60}$ alkyl group, a $C_2$-$C_{60}$ alkenyl group, a $C_2$-$C_{60}$ alkynyl group, or a C1-C60 alkoxy group, which is substituted or unsubstituted in any combination thereof; deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), a $C_3$-$C_{60}$ carbocyclic group, a $C_1$-$C_{60}$ heterocyclic group, or a $C_6$-$C_{60}$ aryloxy group; or a $C_6$-$C_{60}$ arylthio group, which is substituted or unsubstituted in any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or deuterium, —F, a cyano group, a $C_1$-$C_{60}$ alkyl group, a $C_1$-$C_{60}$ alkoxy group, a phenyl group, a biphenyl group, or a $C_3$-$C_{60}$ carbocyclic group or a $C_1$-$C_{60}$ heterocyclic group, which is substituted or unsubstituted in any combination thereof.

In the embodiment, the $X^-$ may be a halide ion, a carboxylate ion, a nitrate ion, a sulfonate ion, or a bisulfate ion. For example, the $X^-$ may be $F^-$, $Cl^-$, $Br^-$, $I^-$, $CH_3COO^-$, $NO_3^-$, $HSO_4^-$, a propionate ion, a benzene sulfonate ion, or the like.

In the embodiment, reflectance measured in a specular component included (SCI) mode on a surface of the reflection adjusting layer 570 may be about 10% or less. For example, the reflection adjusting layer 570 may absorb external light reflection of the display device 1000, so that visibility may be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display area and a non-display area;
a planarization layer disposed on the display area and the non-display area of a substrate, the planarization layer extending from the display area to an end portion of the non-display area;
an opening area disposed in the display area;
an opening periphery area surrounding the opening area; and
an encapsulation layer disposed between the substrate and the planarization layer, wherein
a thickness of a portion of the planarization layer disposed in the opening periphery area is greater than a thickness of a portion of the planarization layer disposed in the display area,
a thickness of a portion of the encapsulation layer disposed in the non-display area decreases as the encapsulation layer is away from the display area, and
a thickness of a portion of the planarization layer disposed in the non-display area increases as the portion of the planarization layer is away from the display area.

2. The display device of claim 1,
wherein
the encapsulation layer includes:
a first inorganic encapsulation layer;
a second inorganic encapsulation layer disposed on the first inorganic encapsulation layer; and
an organic encapsulation layer disposed between the first inorganic encapsulation layer and the second inorganic encapsulation layer,
the first inorganic encapsulation layer and the second inorganic encapsulation layer are entirely disposed in the display area and the non-display area, and
the organic encapsulation layer is not disposed in at least a portion of the non-display area.

3. The display device of claim 2, further comprising:
a dam disposed on the non-display area of the substrate,
wherein the organic encapsulation layer extends from the display area to the dam.

4. The display device of claim 3, wherein a thickness of a portion of the organic encapsulation layer disposed in the non-display area gradually decreases as the portion of the organic encapsulation layer is away from the display area.

5. The display device of claim 2, wherein the organic encapsulation layer is not disposed in at least a portion of the opening periphery area.

6. The display device of claim 5, wherein the thickness of the portion of the planarization layer disposed in the opening periphery area gradually increases as the portion of the planarization layer approaches the opening area.

7. The display device of claim 1, wherein a thickness of the planarization layer disposed at an edge of the non-display area is about 6 μm or more.

8. The display device of claim 1, wherein the planarization layer is formed by a slit coating method.

9. The display device of claim 3, further comprising:
a light emitting element disposed on the display area of the substrate; and
a transistor disposed on the substrate in the display area,
wherein
the light emitting element further includes:
a pixel electrode electrically connected to the transistor;
a light emitting layer disposed on the pixel electrode; and
a common electrode disposed on the light emitting layer, and
the common electrode extends from the display area onto the dam.

10. The display device of claim 9, further comprising:
a sensing electrode disposed on the planarization layer; and
an organic encapsulation layer disposed between the sensing electrode and the common electrode,
wherein a thickness of a portion of the organic encapsulation layer is gradually decreased corresponding to a portion in which a thickness of the planarization layer is gradually increased.

11. The display device of claim 9, further comprising:
a bank layer disposed on the pixel electrode and including a pixel opening overlapping a central portion of the pixel electrode in a plan view.

12. The display device of claim 10, further comprising:
a first insulating layer disposed on the sensing electrode and including an opening overlapping the pixel opening in a plan view; and
a second insulating layer disposed on the first insulating layer, wherein a refractive index of the second insulating layer is larger than a refractive index of the first insulating layer.

13. The display device of claim 12, wherein the opening is disposed in the display area and is not disposed in the non-display area.

14. The display device of claim 11, further comprising:
a first insulating layer disposed on the planarization layer and overlapping the pixel opening in a plan view; and
a second insulating layer disposed on the first insulating layer,
wherein a refractive index of the second insulating layer is smaller than a refractive index of the first insulating layer.

15. The display device of claim 14, wherein the first insulating layer is entirely disposed in the non-display area.

16. The display device of claim 10, further comprising:
a light blocking layer disposed on the planarization layer and overlapping the sensing electrode in a plan view.

17. The display device of claim 16, wherein the light blocking layer is entirely disposed in the non-display area.

18. The display device of claim 16, further comprising:
a reflection adjusting layer disposed on the light blocking layer and the planarization layer and including a dye or a pigment that absorbs light of a specific wavelength.

19. The display device of claim 18, wherein the reflection adjusting layer is entirely disposed in the display area and the non-display area.

* * * * *